(12) United States Patent
Shen

(10) Patent No.: US 12,040,251 B1
(45) Date of Patent: Jul. 16, 2024

(54) 3D COOLING BLOCK FOR HEAT DISSIPATION IN ELECTRONIC DEVICES

(71) Applicant: Yuci Shen, Livermore, CA (US)

(72) Inventor: Yuci Shen, Livermore, CA (US)

( * ) Notice: Subject to any disclaimer, the term of this patent is extended or adjusted under 35 U.S.C. 154(b) by 0 days.

(21) Appl. No.: 18/596,673

(22) Filed: Mar. 6, 2024

(51) Int. Cl.
*H01L 23/427* (2006.01)

(52) U.S. Cl.
CPC .................................. *H01L 23/427* (2013.01)

(58) Field of Classification Search
CPC ..................................................... H01L 23/427
See application file for complete search history.

(56) References Cited

U.S. PATENT DOCUMENTS 7,186,590 B2 * 3/2007 Alcoe ...................... H01L 23/10
257/E23.101
2007/0204646 A1 * 9/2007 Gagliano ................. F28F 13/12
165/104.21
2016/0330868 A1 * 11/2016 Sun ........................ H01L 23/46
2017/0115071 A1 * 4/2017 Lin ..................... F28D 15/0275

* cited by examiner

Primary Examiner — Peniel M Gumedzoe

(57) ABSTRACT

The disclosure describes a 3D (3-dimensional) water block for cooling a heat source of an electronic system such as a semiconductor chip package, comprising: a box with a base plate, a 3D heat exchanger and a circulating liquid; wherein the base plate is attached onto the heat source through a thermal interface material, the 3D heat exchanger includes a heat pipe or vapor chamber structure and a plurality of fin layers, which are attached to the heat pipe or vapor chamber structure so as to form a plurality of channels among them; wherein the heat pipe or vapor chamber structure includes a bottom portion attached to the base plate and a top portion extending upwards from the base plate; and wherein the circulating liquid flows through the plurality of channels for taking away heat from the 3D heat exchanger to an ambient.

16 Claims, 27 Drawing Sheets

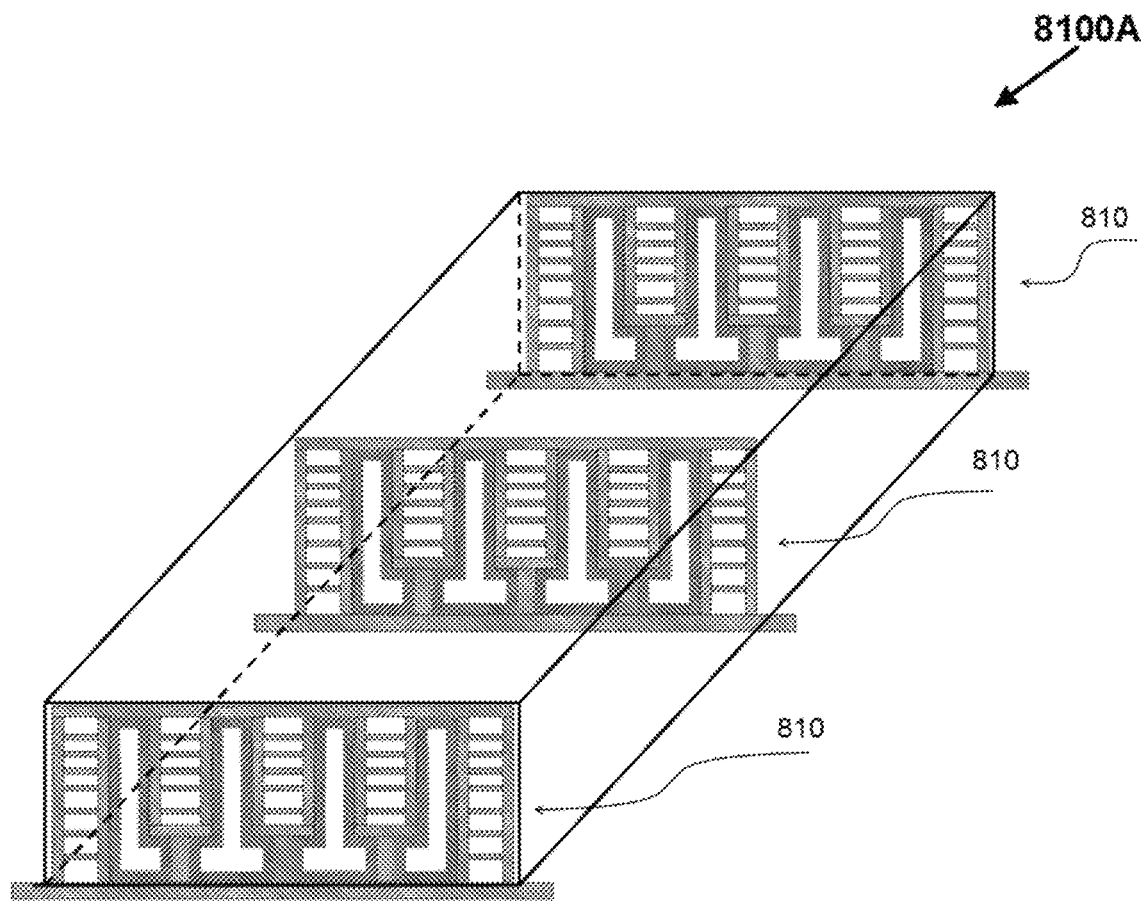
FIG. 8A1

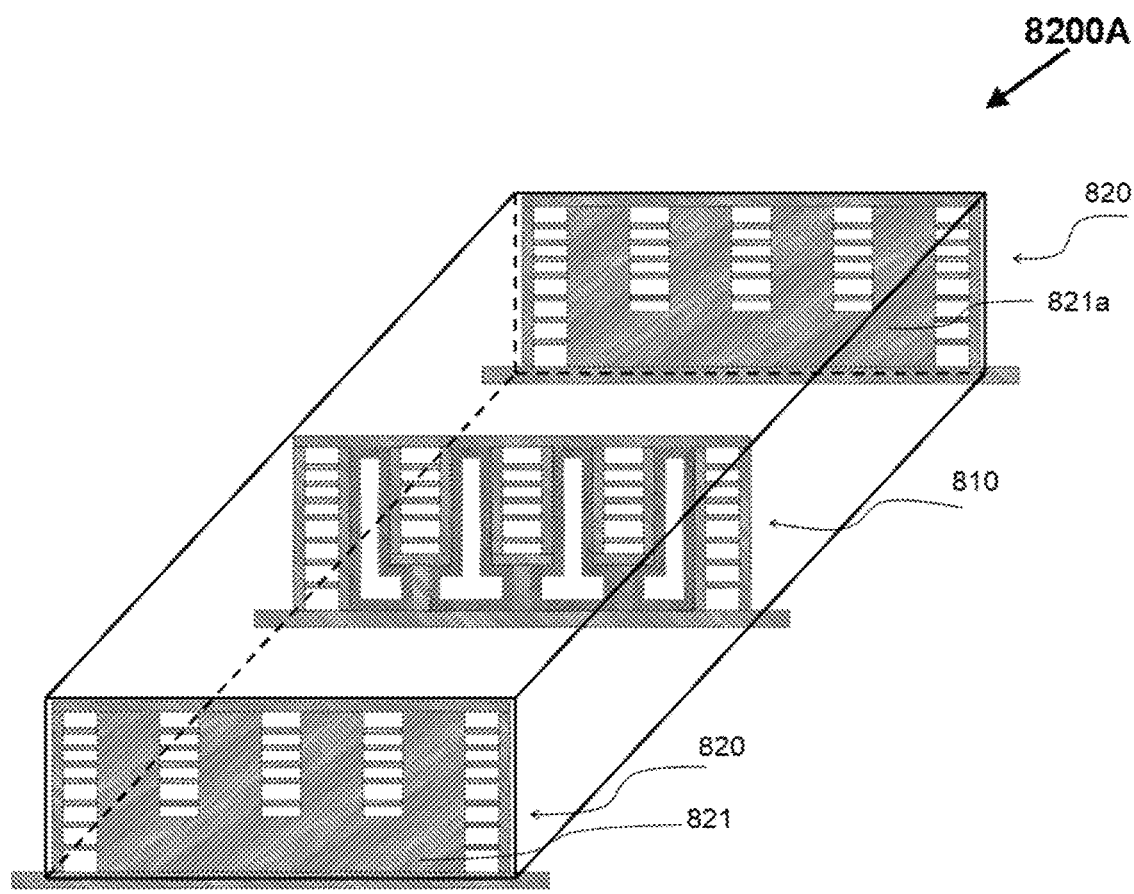
FIG. 8B1

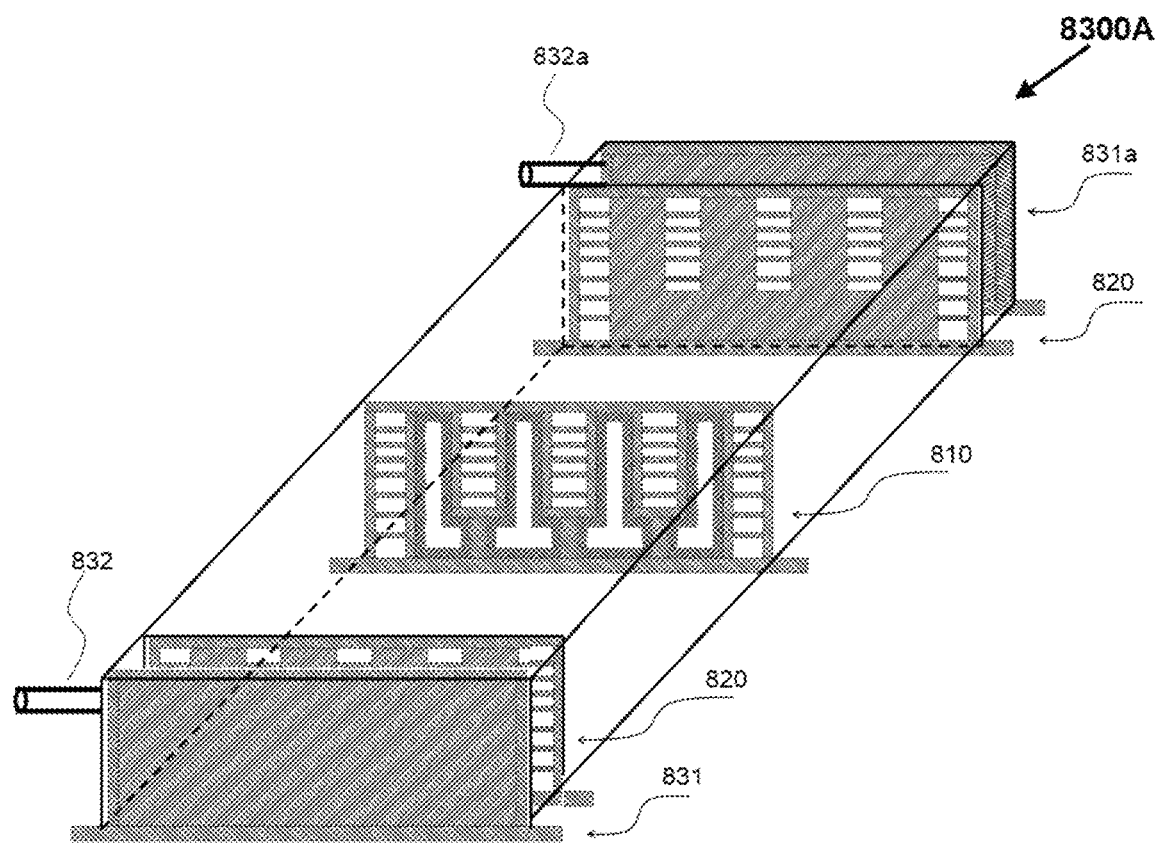
FIG. 8C1

US 12,040,251 B1

3D COOLING BLOCK FOR HEAT DISSIPATION IN ELECTRONIC DEVICES

TECHNICAL FIELD OF THE DISCLOSURE

The disclosure relates generally to a cooler based on a circulating liquid to cool a heat source of an electronic system, and particularly to a water block to cool a heat source such as a semiconductor chip package.

BACKGROUND OF THE DISCLOSURE

For an electronic system with a semiconductor chip package with high power such as a CPU or GPU, a cooler is usually attached onto the semiconductor chip package as a cooling solution. There are two typical coolers. One is an air cooler, such as a heatsink with a fan, in which air is forced to flow through the heatsink to dissipate heat into ambient. The other is a liquid cooler, such as those based on a water block or cold plate, in which liquid is forced to flow through the cooler by a pump. A traditional water block comprises of a chamber with a base plate, wherein a circulating liquid such as water is forced by a pump to flow into the chamber from an inlet and out of the chamber from an outlet so as to take away heat from the base plate attached to a semiconductor chip package. It is noted that a thermal pathway in the heat dissipating processes includes: 1) a heat transferring process, where the heat generated by the semiconductor chip package transfers to the base plate by a thermal conduction process, 2) a heat exchanging process, where the heat in the base plate transfers to the circulating liquid when it passes through the base plate, and 3) a heat dissipating process, where the heat is taken away from the chamber by the circulating liquid and dissipated to the ambient. Of the heat dissipating processes, the heat exchanging process between the base plate and the circulating liquid is critical. In prior arts, some methods have been developed to improve the heat exchange rate between the liquid and the base plate, such as adding a pattern of micro channels on the base plate. However, low heat exchange rate between the liquid and the base plate is still a bottleneck for liquid coolers when cooling a CPU or GPU with high power. To overcome this bottleneck, a 3D (3-dimensional) water block based on a heat pipe or vapor chamber structure is described in the present disclosure.

SUMMARY OF THE DISCLOSURE

The disclosure describes a 3D water block for cooling a heat source such as a semiconductor chip package, comprising: a box including a base plate with a top surface and a bottom surface, a 3D heat exchanger and a circulating liquid; wherein the bottom surface of the base plate is attached onto the semiconductor chip package through a thermal interface material, the 3D heat exchanger includes a heat pipe or vapor chamber structure and a plurality of fin layers, which are attached to the heat pipe or vapor chamber structure so as to form a plurality of channels among them; wherein the heat pipe or vapor chamber structure includes a bottom portion either attached on the top surface of the base plate or combined with the base plate as a portion of it, and a top portion that extends upwards from the base plate and fills the inside of the box; and wherein the circulating liquid flows through the plurality of channels for taking away heat generated by the heat source via the 3D heat exchanger to ambient.

Some preferred embodiments of the present disclosure include: 1) the heat pipe or vapor chamber structure of the 3D water block is a plurality of U-shaped heat pipes, 2) the heat pipe or vapor chamber structure of the 3D water block includes a vapor chamber as its bottom portion and a plurality of heat pipes as its top portion, in which the heat pipes are connected to the vapor chamber along its peripheral edge, 3) the heat pipe or vapor chamber structure of the 3D water block includes a vapor chamber as its bottom portion and a plurality of heat pipes as its top portion, which are connected to the vapor chamber at its top side, and 4) the heat pipe or vapor chamber structure of the 3D water block is a multiple connectivity of vapor chamber, including a horizontal vapor chamber and a plurality of vertical vapor chambers.

The disclosure also describes a panel type of 3D water block for cooling a plurality of heat sources on a PCB (printed circuit board), comprising: a box including a base plate with a top surface and a bottom surface a 3D heat exchanger and a circulating liquid; wherein the bottom surface of the base plate is attached onto the plurality of heat sources through a thermal interface material, the 3D heat exchanger includes a vapor chamber structure attached with a plurality of fin layers, in which a plurality of channels form among the plurality of fin layers; wherein the vapor chamber structure includes a bottom vapor chamber as a portion of the base plate, and a plurality of vertical heat pipes or vapor chambers connected to a top side of the bottom vapor chamber; and wherein the circulating liquid flows through the plurality of channels for taking away heat generated by the heat source via the 3D heat exchanger to ambient.

The features and advantages of the embodiments of the present invention will become more apparent from the detailed descriptions in conjunction with the drawings below. The drawings and associated descriptions are to illustrate the embodiments of the present disclosure, not to limit the scope of what is claimed.

BRIEF DESCRIPTION OF THE DRAWINGS

FIG. 8, FIG. 8A, FIG. 8A1, FIG. 8B, FIG. 8B1, FIG. 8C and FIG. 8C1 are schematic diagrams for illustrating a vapor chamber structure and a method for making the same of one preferred embodiment of the present invention.

DETAILED DESCRIPTION OF THE PREFERRED EMBODIMENT

Figure 1:
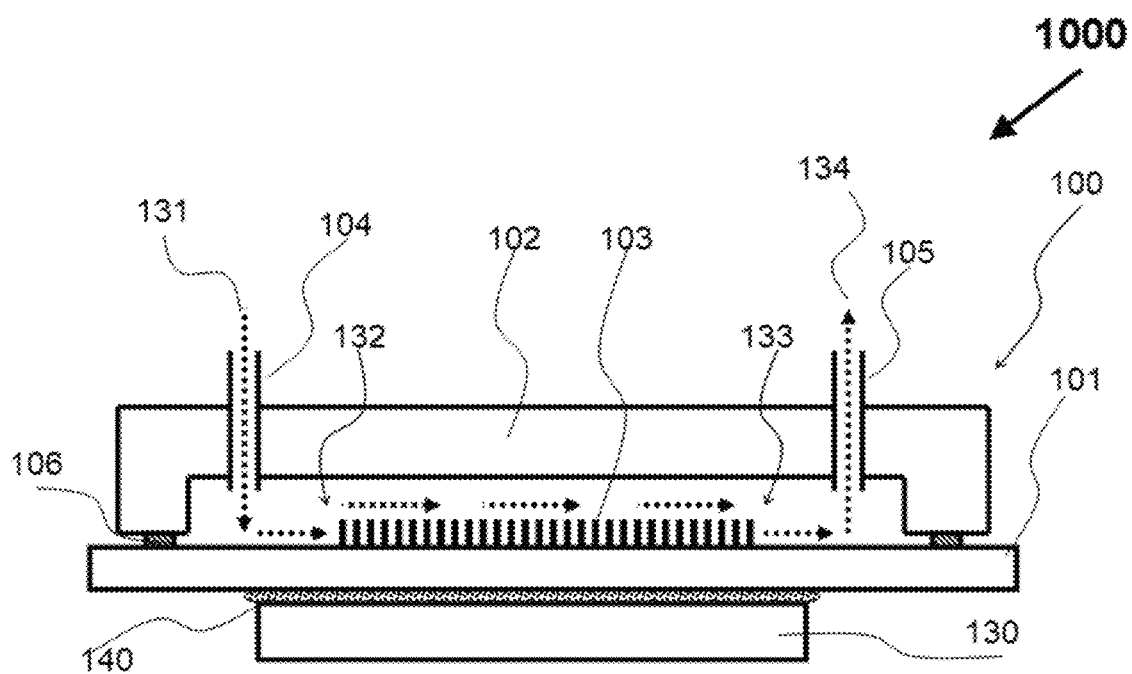
FIG. 1, FIG. 1A and FIG. 1B are schematic diagrams for illustrating a traditional water block and its working mechanism of prior arts.
Figure 1A:
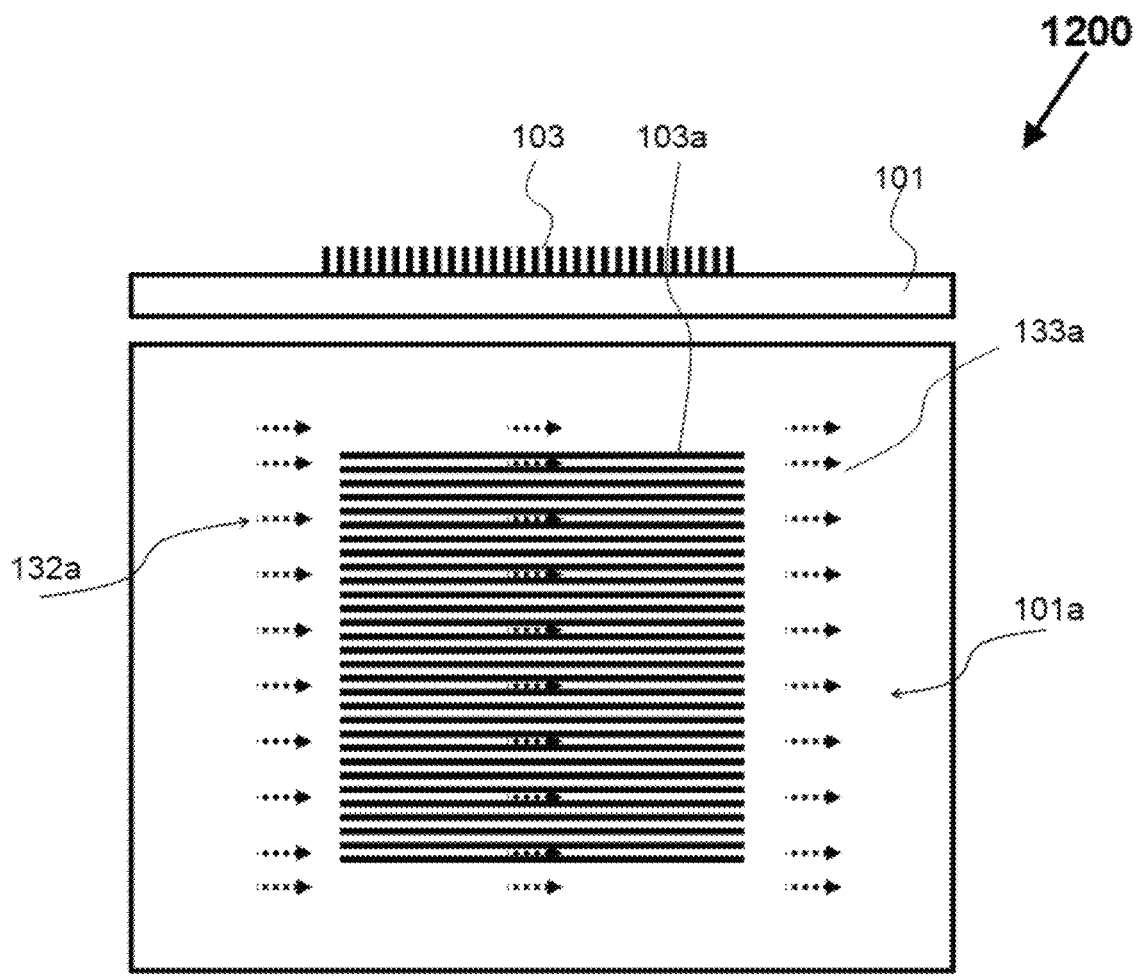
Figure 1B:
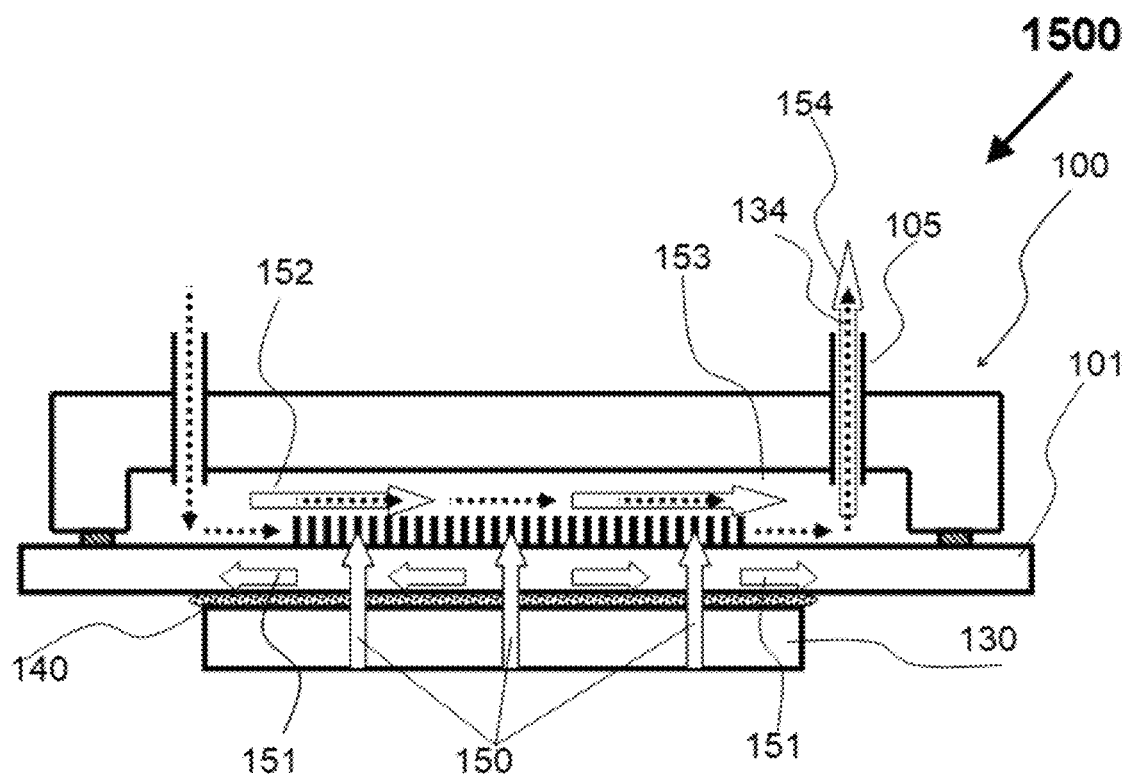

FIG. 1, FIG. 1A and FIG. 1B are schematic diagrams for illustrating a traditional water block and its working mechanism of prior arts. The numerical symbol 1000 in FIG. 1 designates a cross-sectional view of a traditional water block 100 which is attached onto a heat source 130 through a thermal interface material 140. The water block 100 basically includes a base plate 101 with some micro channels 103, a cover 102, an inlet 104 and an outlet 105. The 106 designates a seal or a bonding connection between the base plate 101 and the cover 102 for them to form a sealed chamber. The dashed arrows designated by the numerical symbols 131, 132, 133 and 134 are for illustrating a circulating liquid which flows into the water block 100 from the inlet 104, then passes through the top surface, including the micro channels 103, of the base plate 101 as shown by the dashed arrows from 132 to 133, and then flows out of the water block 100 from the outlet 105. The water block 100 is traditionally named because water is usually used as a circulating liquid; another traditional name for it is a cold plate, because cold liquid continuously passes through it in its application. The numerical symbol 1200 in FIG. 1A designates the base plate from its cross-sectional view 101 and from its top view 101a, in which the 132a and 133a designate the circulating liquid 132 and 133 as shown in FIG. 1, which flows through or passes the base plate 101/101a and the micro channels 103a. The numerical symbol 1500 in FIG. 1B is for illustrating the working mechanism of the water block 100, in which some arrows designated by the numerical symbols 150, 151, 152, 153 and 154 are added in contrast to FIG. 1 to illustrate a thermal pathway detailing how the heat generated by the heat source 130 is dissipated to ambient by the water block 100. The arrows 150 are for illustrating that the heat generated by the heat source 130 transfers to the base plate 101 via a thermal conduction process, the arrows 151 are for illustrating that the heat further spreads throughout the base plate 101, the arrows 152 and 153 are for illustrating the heat exchange between the base plate 101 and the circulating liquid 132/133 that takes place when the liquid passes the base plate 101, and the arrow 154 is for illustrating that the heat is taken out of the water block 100 by the circulating liquid 134 when it flows out from the outlet 105.

It is noted that a heat exchange between the base plate 101 and the circulating liquid takes place at a top surface of the base plate 101 when the circulating liquid flows over or passes the top surface of the base plate 101 as shown by the arrows 132/133 in FIG. 1 or 132a/133a in FIG. 1A. In other words, the circulating liquid with a lower temperature flows into the water block 100 from the inlet 104, then it is heated when it passes the base plate 101, and then the heated circulating liquid with a higher temperature flows out of the water block 100 from the outlet 105. It is further noted that the heat exchange between the base plate 101 and the circulating liquid only takes place at a top surface of the base plate 101, where some micro channels 103/103a as shown in FIG. 1 and FIG. 1A are usually added to enhance the heat exchange rate between them. It is also noted that the pattern of the micro channels 103/103a is not limited to the example shown in FIG. 1A, and that it can be designed to have various patterns to optimize the flowing path of the circulating liquid. However, regardless of any pattern of micro channels, the heat exchange rate in a traditional water block is limited to a low efficiency because the heat exchange only takes place on a top surface of the base plate 101/101a. Due to the fact that the heat exchange only takes place on a top surface of the base plate for a traditional water block, this prior art design will be called a 2D (2-dimensional) water block herein. In contrast, a 3D (3-dimensional) water block is disclosed in the present invention (which can also called a cold block in contrast to a traditional cold plate of prior arts), wherein a heat pipe or vapor chamber structure is introduced into the 3D water block so that a 3D heat exchange is achieved, which will be depicted in conjunction with drawings below.

Figure 2:
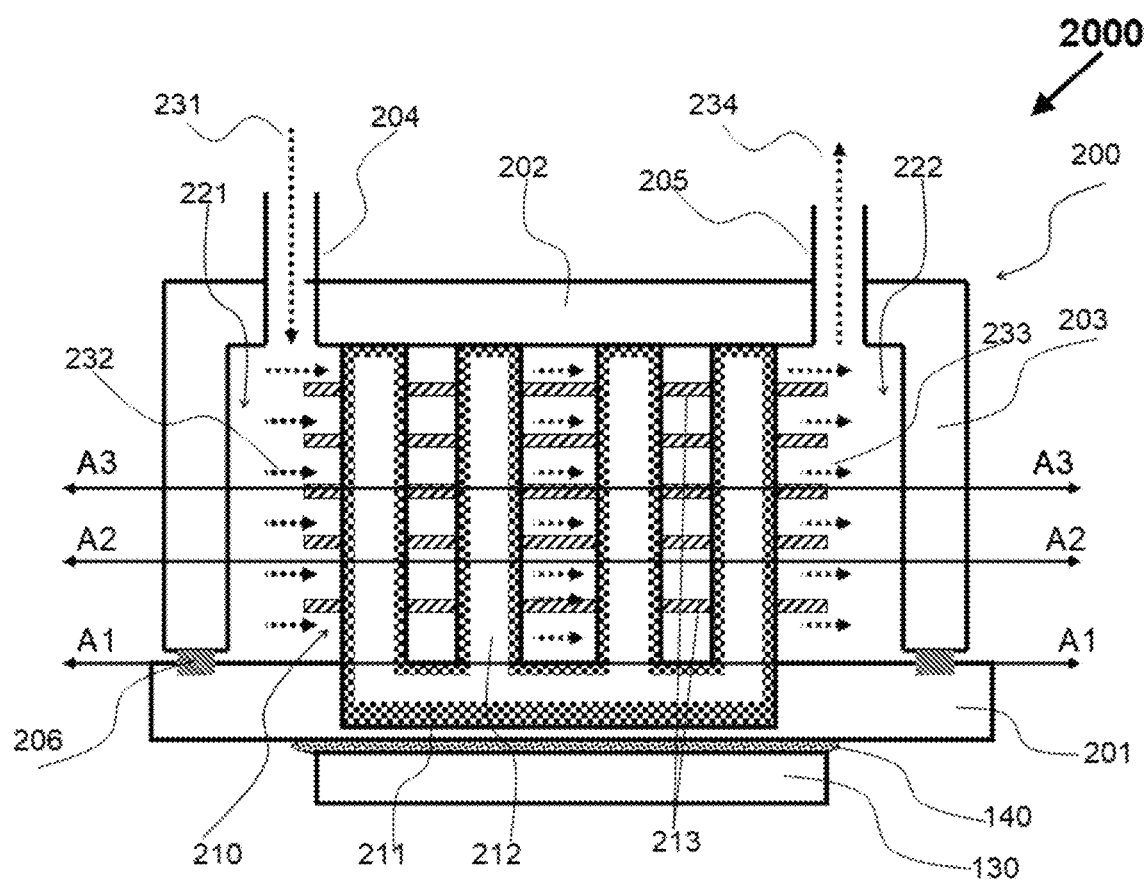
FIG. 2, FIG. 2A, FIG. 2B, FIG. 2C and FIG. 2D are schematic diagrams for illustrating a 3D water block of the present invention.

FIG. 2 is a schematic diagram for illustrating a 3D water block of one preferred embodiment of the present invention. The numerical symbol 2000 in FIG. 2 designates a cross-sectional view of a 3D water block 200 which is attached onto a heat source 130, such as a semiconductor package, through a thermal interface material 140, in which the numerical symbol 200 designates the 3D water block, comprising: a box 201/202/203 including a base plate 201 and a cover 202/203 formed from a top piece 202 and a side wall 203, a 3D heat exchanger 210 which is enclosed inside the box 201/202/203, and a circulating liquid as illustrated by the dashed arrows 231/232/233/234. The numerical symbols 204 and 205 designate an inlet and an outlet of the box for the circulating liquid to flow into and out of the box, and the 206 designates a seal or a bonding connection between the base plate 201 and the cover 202/203 for them to form a sealed box. The 3D heat exchanger 210 includes a heat pipe or vapor chamber structure 211/212 and a plurality of fin layers 213 which is attached to the heat pipe or vapor chamber structure 211/212 so as to form a plurality of channels among the plurality of fin layers. The heat pipe or vapor chamber structure 211/212 includes a bottom portion 211 and a top portion 212, wherein the bottom portion 211 is either attached to the top surface of the base plate 201 or combined with the base plate 201 as a portion of it, and the top portion 212 extends upwards from the base plate 201 and fills inside the box 201/202/203 to form a 3D structure. The circulating liquid 231/232/233/234 flows into the box from the inlet 204, then passes the 3D heat exchanger 210 from one side 221 to another side 222 between the 3D heat exchanger 210 and the side wall 203, and then flows out of the box from the outlet 205. When the circulating liquid 231/232/233/234 passes the 3D heat exchanger 210, or in other words it flows through the plurality of channels among the plurality of fin layers 213, it is heated by the 3D heat exchanger 210 and a heat exchange between the circulating liquid and the 3D heat exchanger 210 takes place. This is further depicted in conjunction with drawing in the following FIG. 2A. Finally, the arrow lines A1 to A1, A2 to A2 and A3 to A3 designate some locations for some horizontal cross-sectional views of the 3D heat exchanger 210 to further display its structure in conjunction with drawings in FIG. 2B, FIG. 2C and FIG. 2D in the following.

Figure 2A:
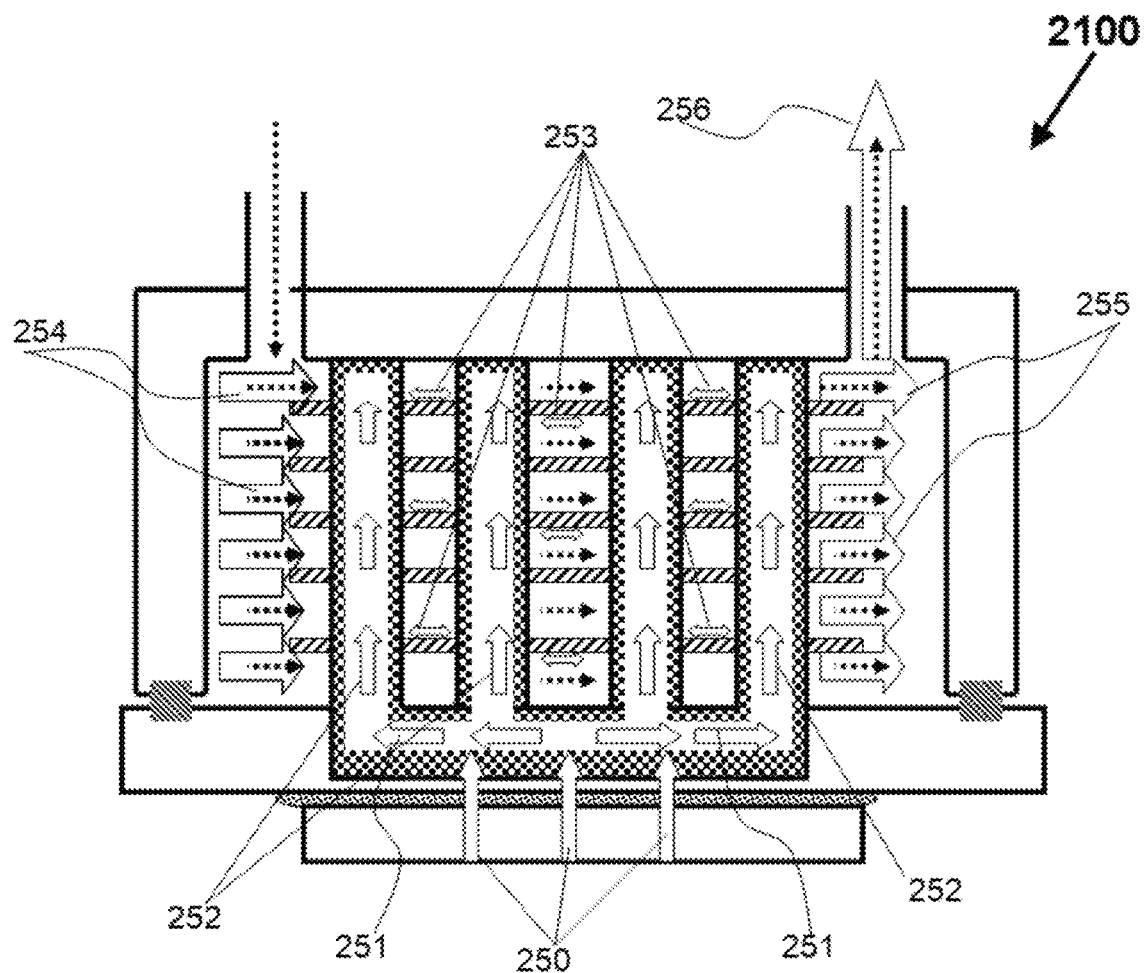

FIG. 2A is a schematic diagram for illustrating a thermal pathway for the 3D heat exchanger 210 to cool the heat source 130, in which some arrows designated by the numerical symbols 250, 251, 252, 253, 254, 255 and 256 are added in contrast to FIG. 2 to illustrate the thermal pathway of how the heat generated by the heat source 130 is taken to ambient by the 3D water block 200. The arrows 250 are for illustrating that the heat generated by the heat source 130 transfers to the base plate 201 and the bottom portion 211 of the heat pipe or vapor chamber structure 211/212 via a thermal conduction process, the arrows 251 and 252 are for illustrating heat spreading throughout the bottom portion 211 and up to the top portion 212 of the heat pipe or vapor chamber structure 211/212 via a phase changing manner where a liquid inside the heat pipe or vapor chamber structure 211/212 changes from a liquid state to a vapor state, the arrows 253 are for illustrating heat spreading from the top portion 212 to the plurality of fin layers 213, the arrows 254 and 255 are for illustrating a heat exchange between the 3D heat exchanger 210 and the circulating liquid 232/233 when it flows through the plurality of channels among the plurality of fin layers 213, or in other words when it passes the 3D heat exchanger 210 as shown in FIG. 2 and in the following FIG. 2D, and the arrow 256 is for illustrating that the heat is taken out of the 3D water block 200 by the circulating liquid when it flows out of the box from the outlet 205 as shown in FIG. 2.

It is noted that for the traditional water block 100 of prior arts, the heat generated by the heat source 130 transfers to the circulating liquid only from the top surface of its base plate 101 as shown in FIG. 1, FIG. 1A and FIG. 1B. In contrast, for the 3D water block 200 of present invention, the heat generated by the heat source 130 transfers to the circulating liquid from a 3D heat exchanger 210, including the plurality of fin layers 213, the heat pipe or vapor chamber structure 211/212 as well as the top surface of the base plate 201, as shown in FIG. 2 and FIG. 2A. According to their different heat transferring methods, the present water block and the traditional water block are respectively called a 3D water block and a 2D water block herein.

It is also noted that the heat pipe or vapor chamber structure 211/212 can quickly transfer heat from its bottom portion 211 to its top portion 212 via a phase change liquid enclosed inside the heat pipe or vapor chamber structure. When this liquid is heated at the bottom portion 211, it changes from a liquid to a vapour, and rises to fill the top portion 212. The heat then spreads from the top portion 212 to the plurality of fin layers 213, where it is then transferred to and taken away by the circulating liquid. This cools the phase change liquid, causing it to change back to liquid and flow back to the bottom portion 211 via a capillary action, completing the cycle. Through this method, the original 2D heat dissipation surface is effectively changed to a 3D heat dissipation structure, thus achieving a high heat exchange rate between the circulating liquid and the 3D heat exchanger by massively increasing the surface area between the two.

Figure 2B:
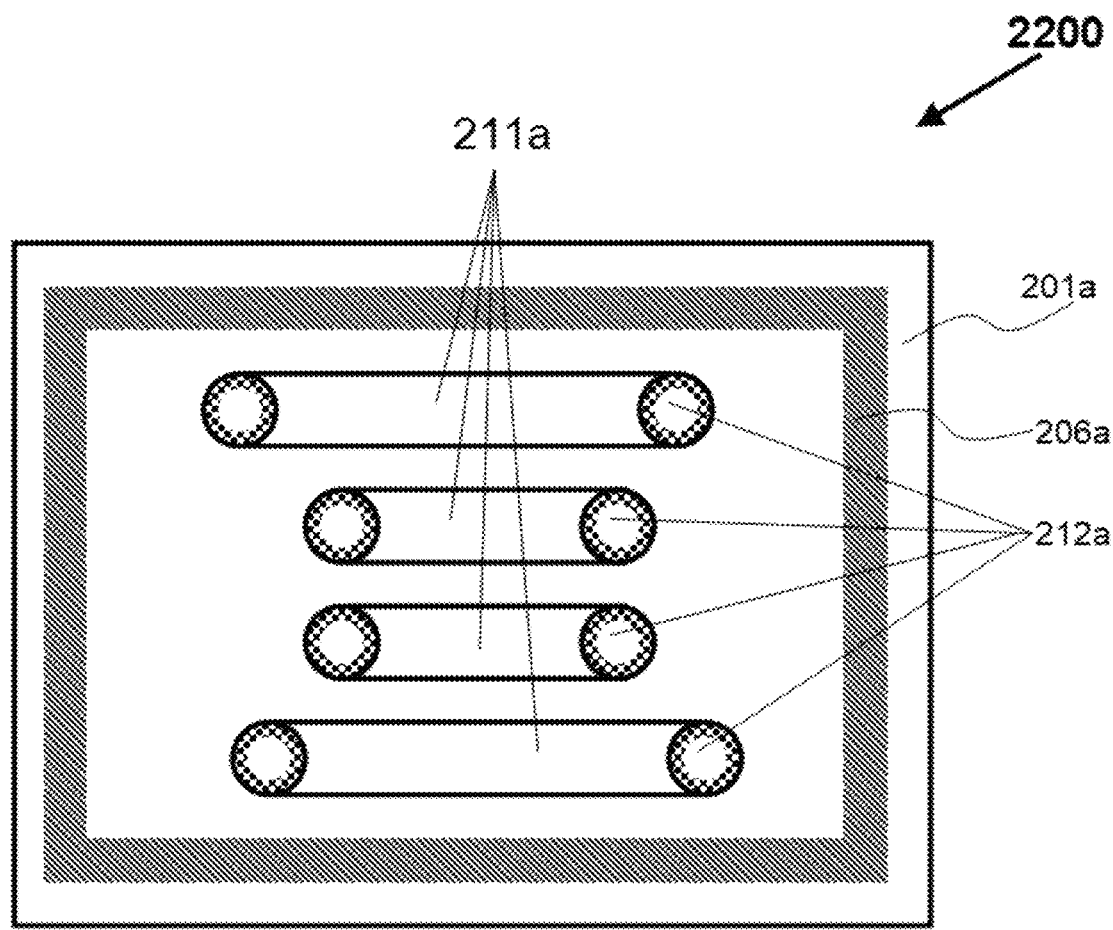
Figure 2C:
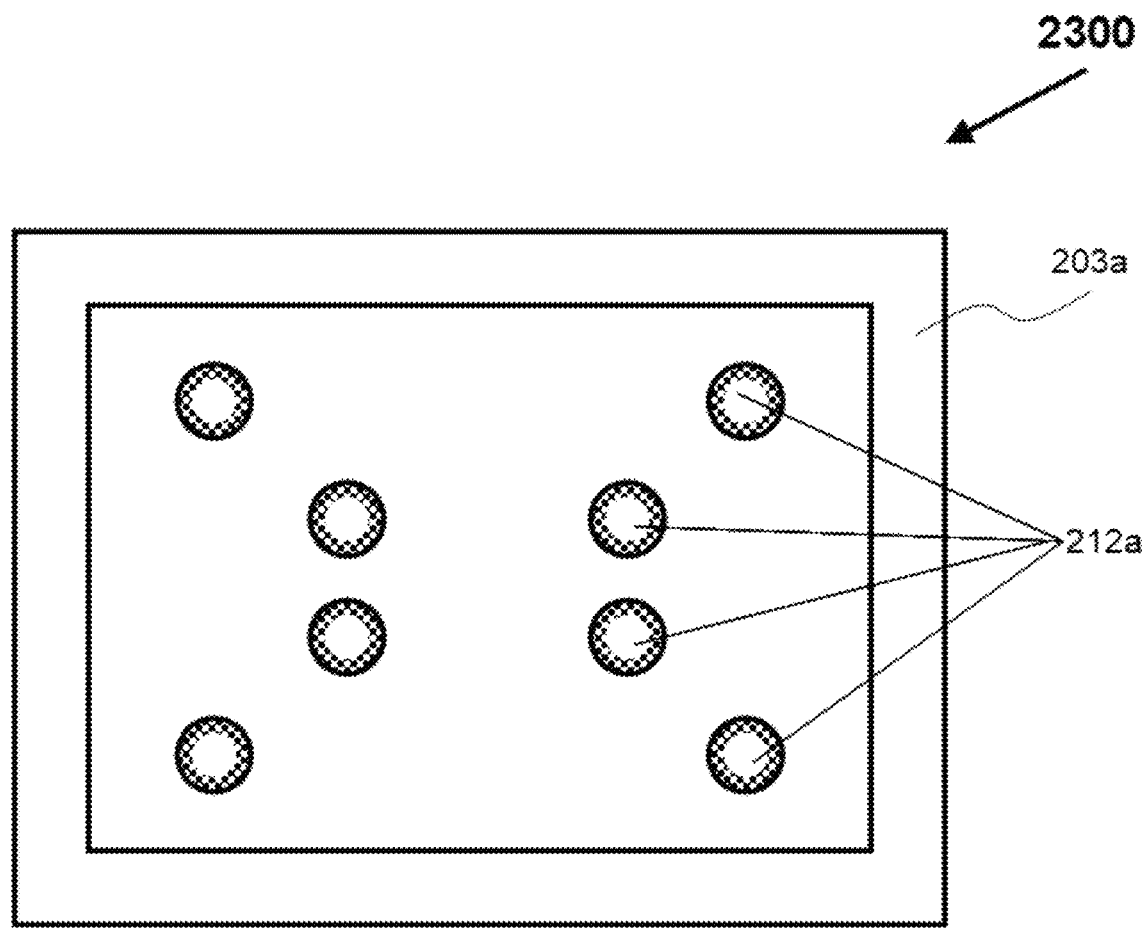
Figure 2D:
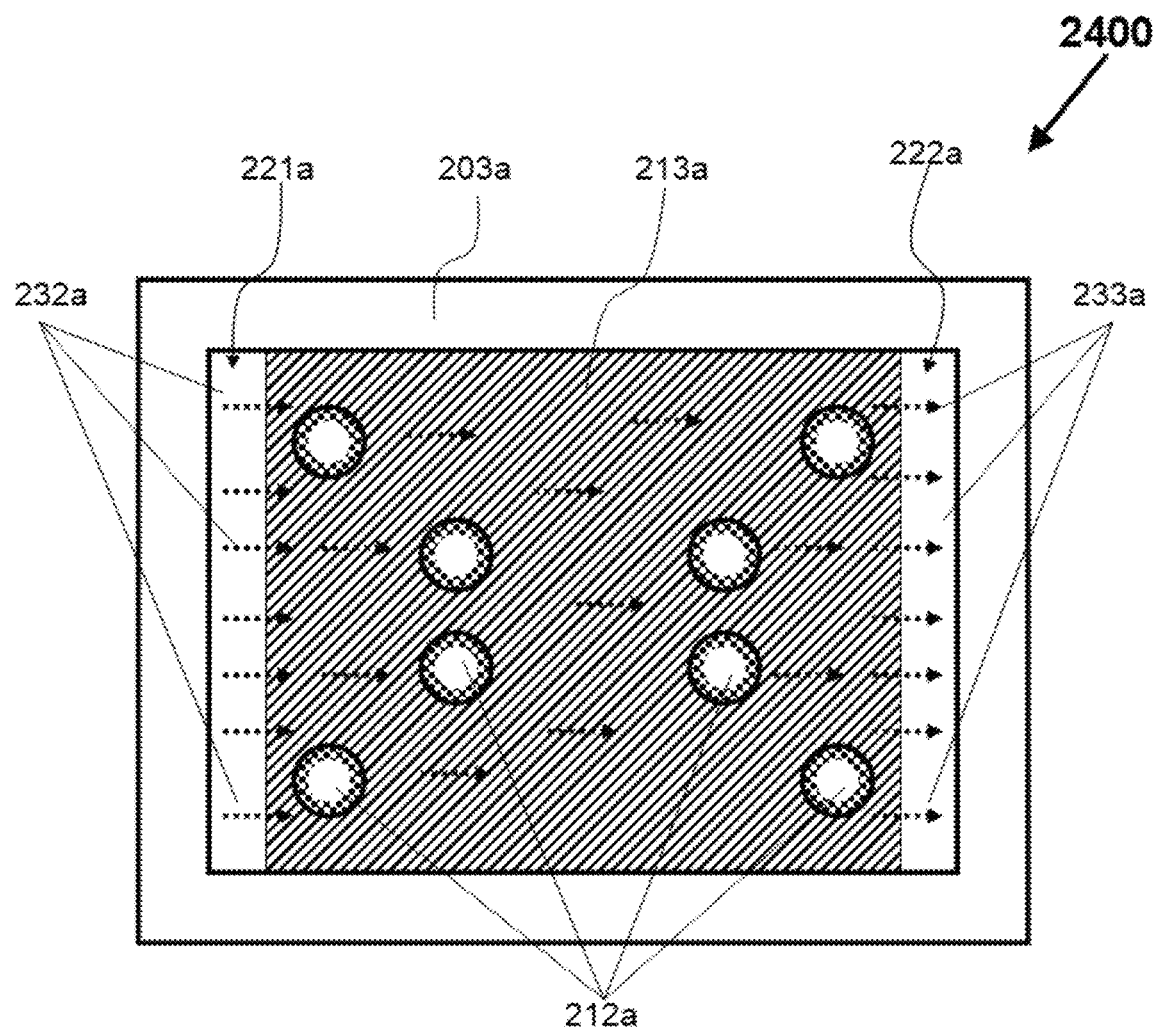

FIG. 2B, FIG. 2C and FIG. 2D are schematic diagrams for further illustrating the structure of the 3D water block 200 as shown in FIG. 2. The numerical symbol 2200 in FIG. 2B designates a cross-sectional top view of the 3D water block 200 from the cross-sectional location A1 to A1 as marked in FIG. 2, in which the 201a designates the cross-sectional top view of the base plate 201, the 206a designates the cross-sectional top view of the seal or the bonding connection 206, the 211a designates the top view of the bottom portion 211, and the 212a designates the cross-sectional top view of the top portion 212 as shown in FIG. 2. The numerical symbol 2300 in FIG. 2C designates a cross-sectional top view of the 3D water block 200 from the cross-sectional location A2 to A2 as marked in FIG. 2, in which the 203a designates the cross-sectional top view of the side wall 203, and the 212a designates the cross-sectional top view of the top portion 212 as shown in FIG. 2. The numerical symbol 2400 in FIG. 2D designates a cross-sectional top view of the 3D water block 200 from the cross-sectional location A3 to A3 as marked in FIG. 2, in which the 213a designates a cross-sectional top view of the plurality of fin layers 213, the 221a and 222a designate the two gaps 221 and 222 in FIG. 2, the arrows 232a and 233a designate a cross-sectional top view of the circulating liquid when it passes the plurality of fin layers 213a from the gap 221a at one side to the gap 222a at another side between the plurality of fin layers 213a and the side wall 203a. It is seen from the drawings in FIG. 2, FIG. 2B and FIG. 2C that the heat pipe or vapor chamber structure 210 includes a plurality of U-shaped of heat pipes with a flat bottom portion attached to the base plate 201 of one embodiment of the present invention. It is noted that a cross-sectional top view means a top portion of the 3D water block is first removed from a horizontal cross-sectional location such as A1 to A1, and then it is viewed from its top herein.

It is noted that how the circulating liquid 231/232/233/234 flows through the plurality of channels among the plurality of fin layers 213 or passes the 3D heat exchanger 210 can be flexibly designed, and the embodiment displayed in FIG. 2 to FIG. 2D is a flowing pathway for it to pass through the 3D heat exchanger 210 from one side to another side. Another embodiment will be displayed in conjunction with FIG. 3 and FIG. 3A in the following, in which another flowing pathway for a circulating liquid to pass through a 3D heat exchanger from its central region to its peripheral region is displayed.

Figure 3:
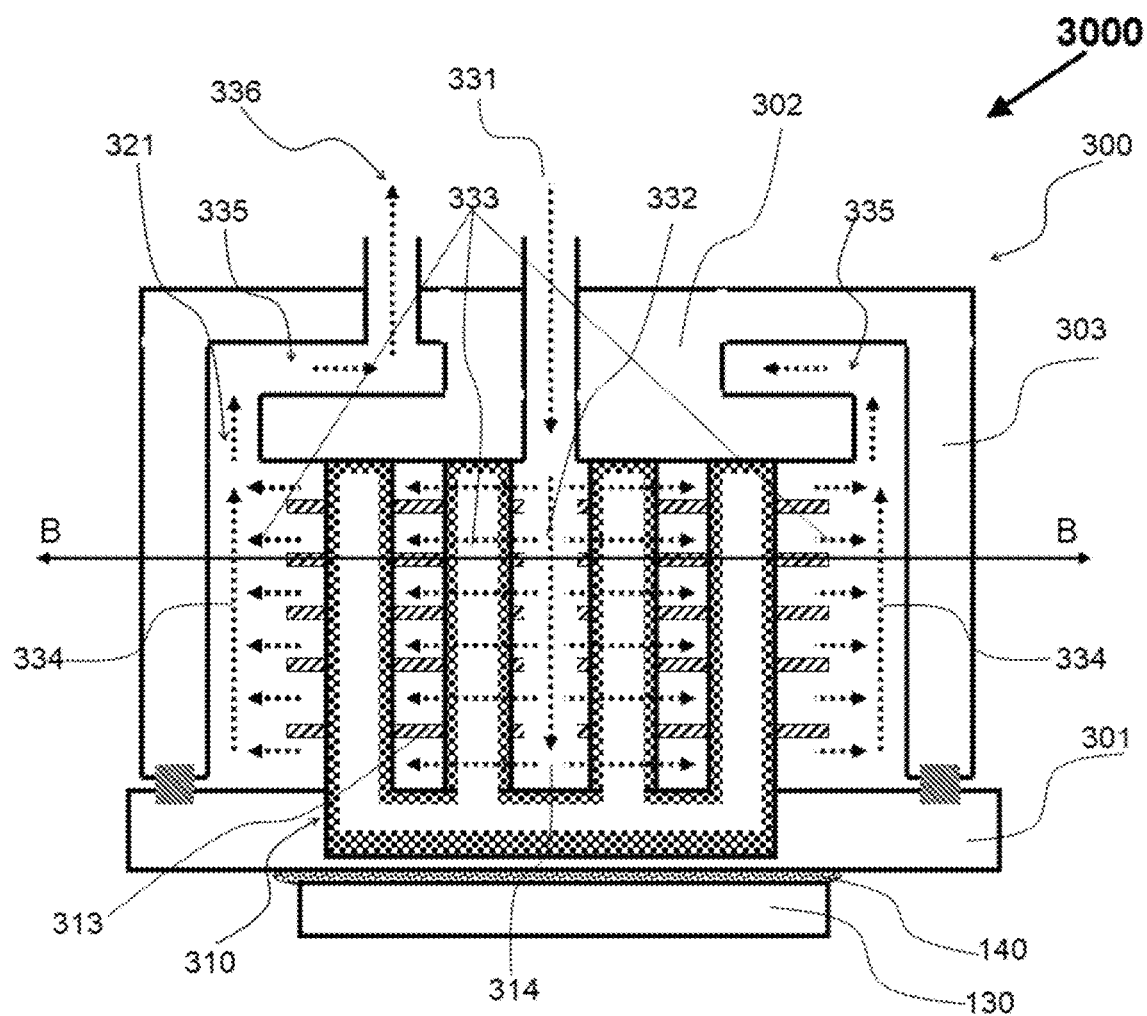
FIG. 3 and FIG. 3A are schematic diagrams for illustrating a flowing pathway for a circulating liquid to flow through a 3D heat exchanger of one preferred embodiment of the present invention.
Figure 3A:
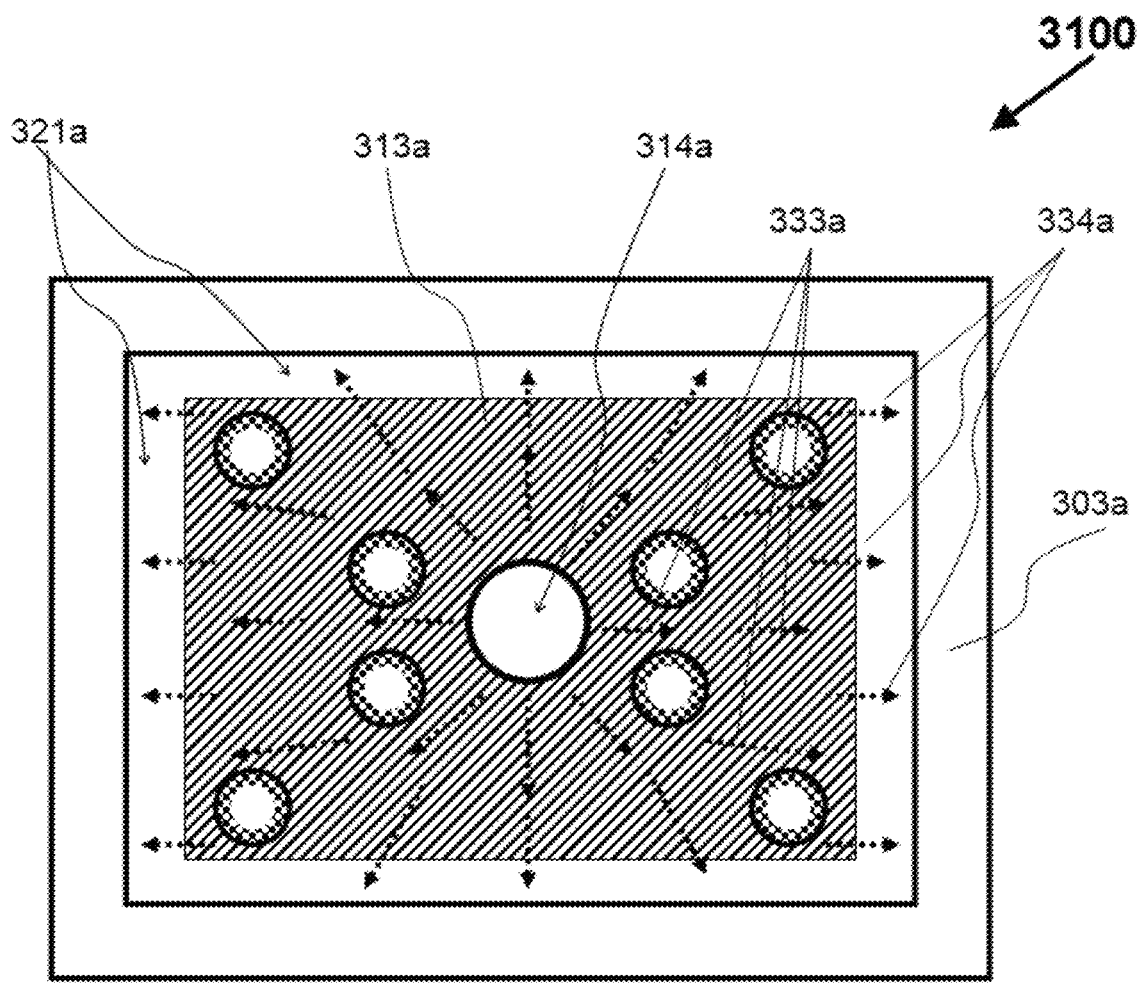

FIG. 3 and FIG. 3A are schematic diagrams for illustrating a flowing pathway for a circulating liquid to flow through a 3D heat exchanger of another preferred embodiment of the present invention. The numerical symbol 3000 in FIG. 3 designates a cross-sectional view of a 3D water block 300 which is attached onto a heat source 130, such as a semiconductor package, through a thermal interface material 140, in which the numerical symbol 300 designates a 3D water block, the 301/302/303 designates a box including a base plate 301 and a cover 302/303 with a top piece 302 and a side wall 303, the 310 designates a 3D heat exchanger enclosed inside the box, and the dashed arrows designated by the numerical symbols 331/332/333/334/335/336 are for illustrating a circulating liquid which passes the 3D heat exchanger 310 according to a flowing pathway from 331 to 332 to 333 to 334 to 335 and to 336. It is noted that the top piece 302 can be flexibly designed to guide the circulating liquid to flow downwards from the inlet 331 into a hole 314 at the central region of the plurality of fin layers 313 as shown by the arrows from 331 to 332, then spread to a gap 321 at a peripheral region between the 3D heat exchanger 310 and the side wall 303 as shown by the arrows from 333 to 334, and then flow out of the box from its top piece 302 via an outlet as shown by the arrows from 335 to 336. The arrow line from B to B is for a location where a cross-section view of the 3D heat exchanger 310 will be displayed in the following FIG. 3A to further illustrate the flowing pathway for the circulating liquid to pass through the 3D heat exchanger 310. The numerical symbol 3100 in FIG. 3A designates a cross-sectional top view of the 3D water block 300 from the cross-sectional location B to B as marked in FIG. 3, in which the 313a designates a top view of the plurality of fin layers 313 in FIG. 3, the 314a designates the hole 314 in FIG. 3 at a central region of the plurality of fin layers 313a, the 321a designates the gap 321 in FIG. 3 between the plurality of fin layers 313a and the side wall 303a, the arrows 333a to 334a designate that the circulating liquid passes the plurality of fin layers 313a from the hole 314a to the gap 321a.

The spirit and scope of the present invention is to use a heat pipe or vapor chamber structure to form a 3D water block so as to achieve a 3D heat exchange between a heat source and a circulating liquid. Even though the heat pipe or vapor chamber structure as described in FIG. 2 to FIG. 3 is formed based on a heat pipe, it can also formed based on a vapor chamber and/or a heat pipe. Some featured heat pipe or vapor chamber structures will be described in conjunction with the drawings in the following.

Figure 4:
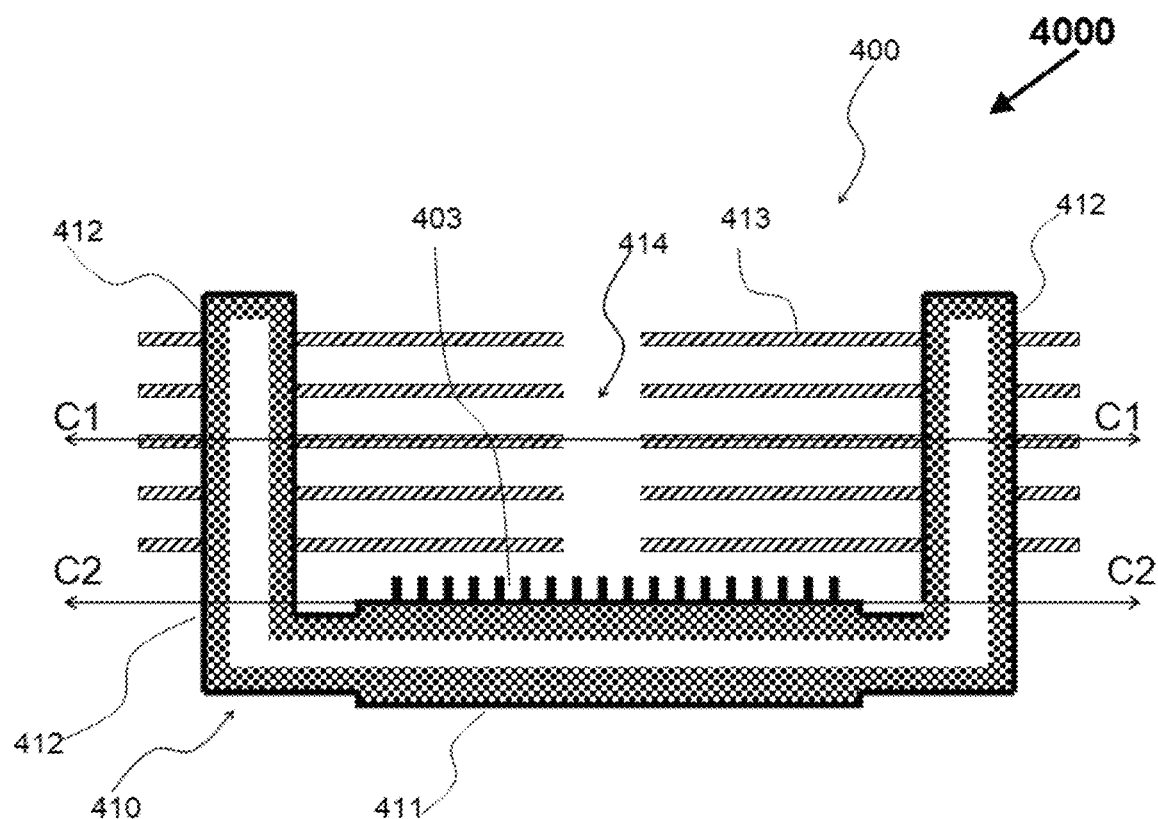
FIG. 4, FIG. 4A and FIG. 4B are schematic diagrams for illustrating a heat pipe or vapor chamber structure of one preferred embodiment of the present invention.
Figure 4A:
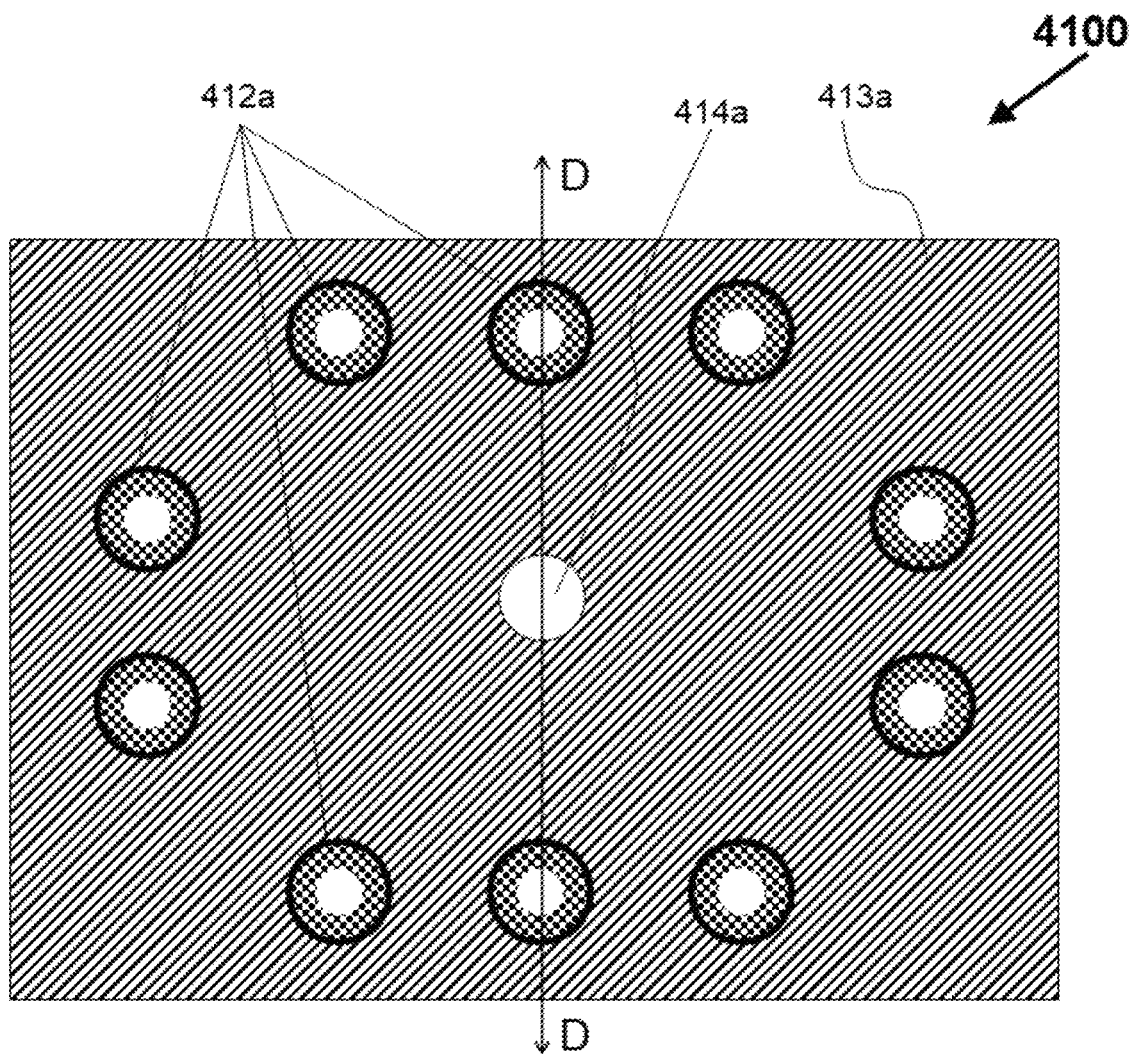
Figure 4B:
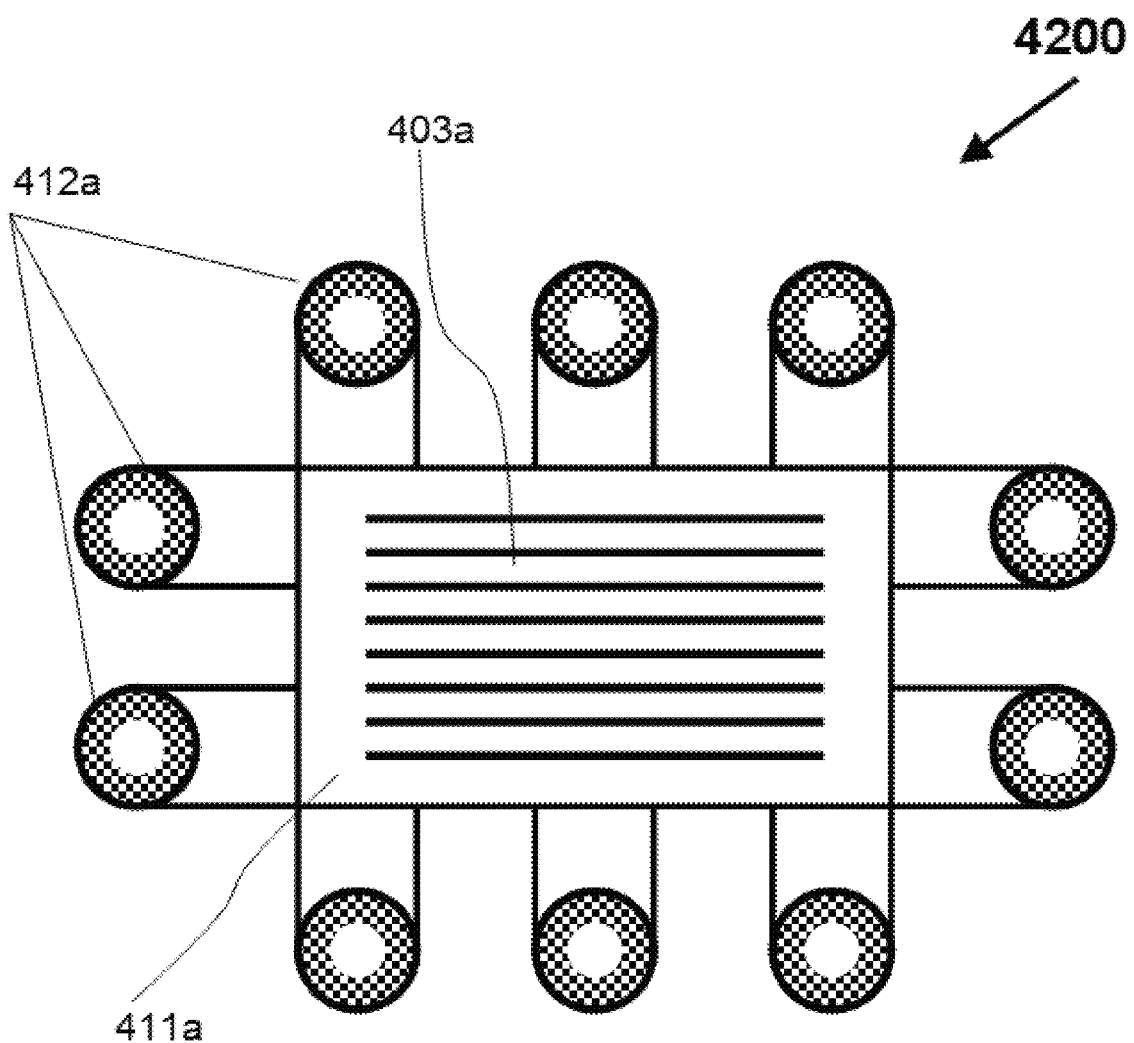

FIG. 4, FIG. 4A and FIG. 4B are schematic diagrams for illustrating a heat pipe or vapor chamber of structural of one preferred embodiment of the present invention. The numerical symbol 4000 in FIG. 4 designates a cross-sectional view of a 3D heat exchanger 400, in which the numerical symbol 410 designates a heat pipe structure including a bottom portion 411 and a top portion 412, the 413 designates a plurality of fin layers that have a hole at its middle region, which is attached to the top portion 412, and the 403 designates a plurality of micro channels formed on a top surface of the bottom portion 411 as an option. The arrow lines C1 to C1 and C2 to C2 are two locations for a cross-sectional view to further display the structure of the 3D heat exchanger 400. The numerical symbol 4100 in FIG. 4A designates a cross-sectional top view of the 3D heat exchanger 400 from the cross-sectional location C1 to C1 in FIG. 4, in which the numerical symbol 412a designates the top portion 412 of the heat pipe or vapor chamber structure 410, and the 413a and 414a designate a plurality of fin layers 413 with the hole 414. It is seen from the cross-sectional top view 412a of the top portion 412 of the heat pipe or vapor chamber structure 410 that the top portion 412 includes a plurality of heat pipes. The arrow line D to D shows a cross-sectional location to see the 3D heat exchanger 400 in FIG. 4. The numerical symbol 4200 in FIG. 4B designates a cross-sectional top view of the 3D heat exchanger 400 from the cross-sectional location C2 to C2 in FIG. 4, in which the numerical symbol 412a designates the top portion 412 of the heat pipe structure 410, the 411a designates a top view of the bottom portion 411 which is a vapor chamber, and the 403a designates the micro channels 403. It is seen from FIG. 4, FIG. 4A and FIG. 4B that the plurality of heat pipes 412a are connected to the vapor chamber 411a from its peripheral edge region and extend upwards from the bottom vapor chamber 411a.

Figure 5:
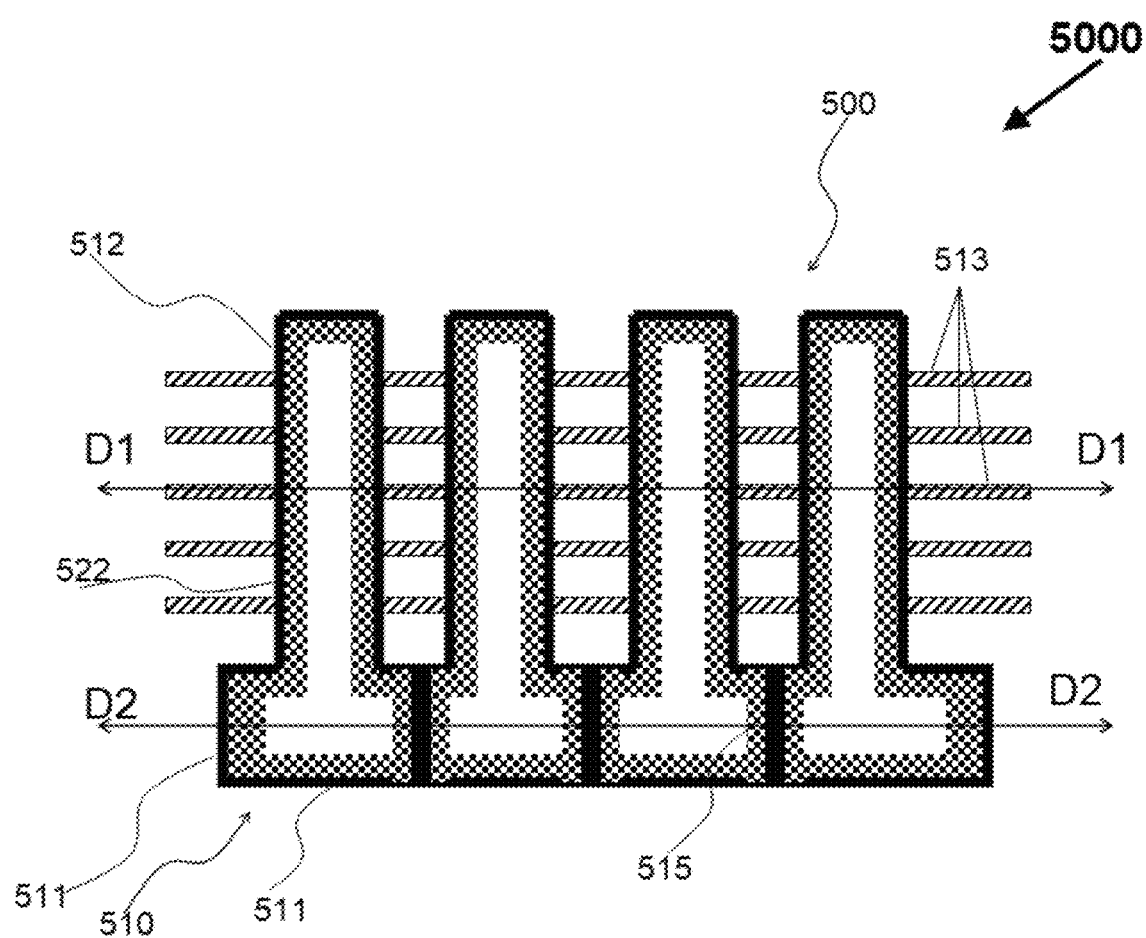
FIG. 5, FIG. 5A and FIG. 5B are schematic diagrams for illustrating another heat pipe or vapor chamber structure of another preferred embodiment of the present invention.
Figure 5A:
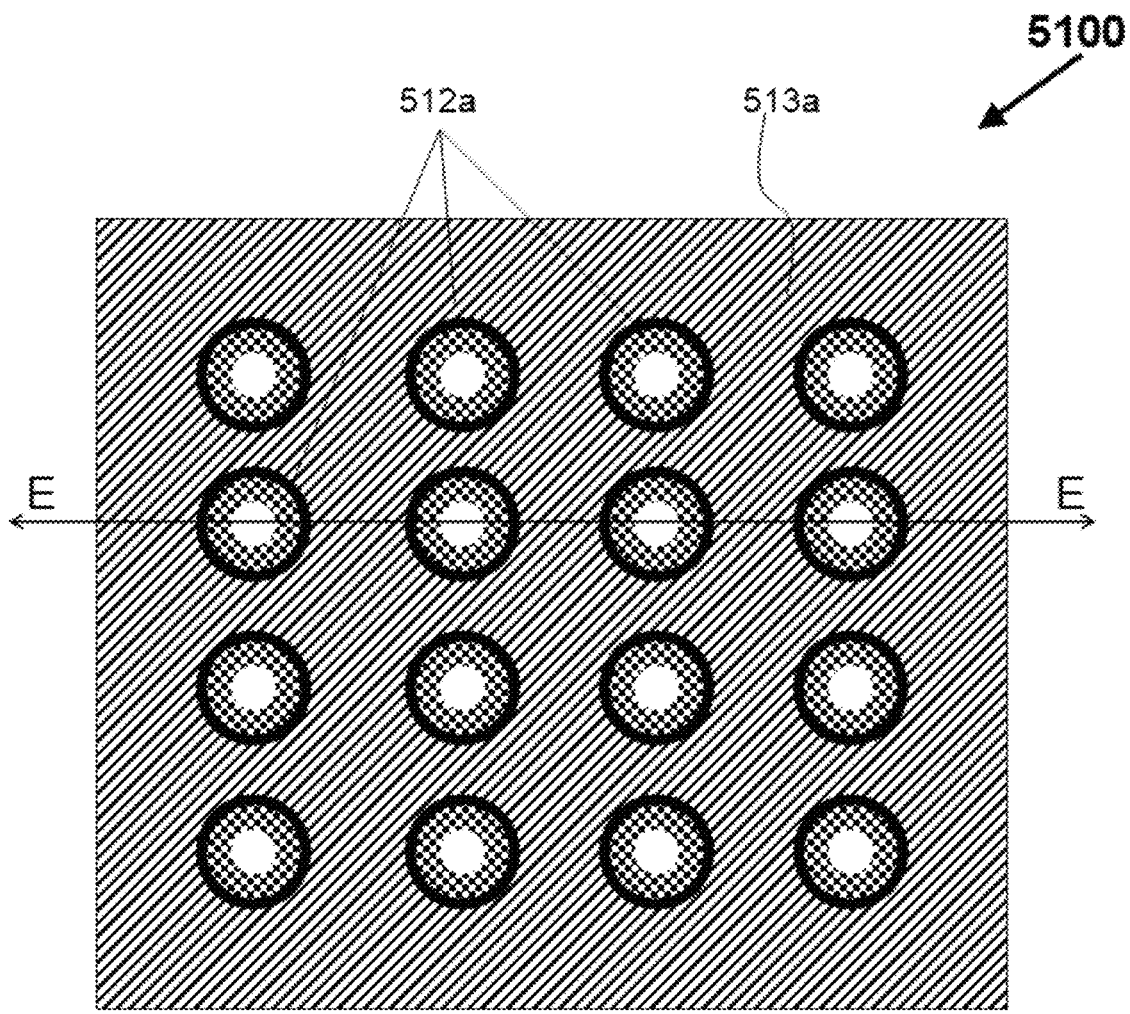
Figure 5B:
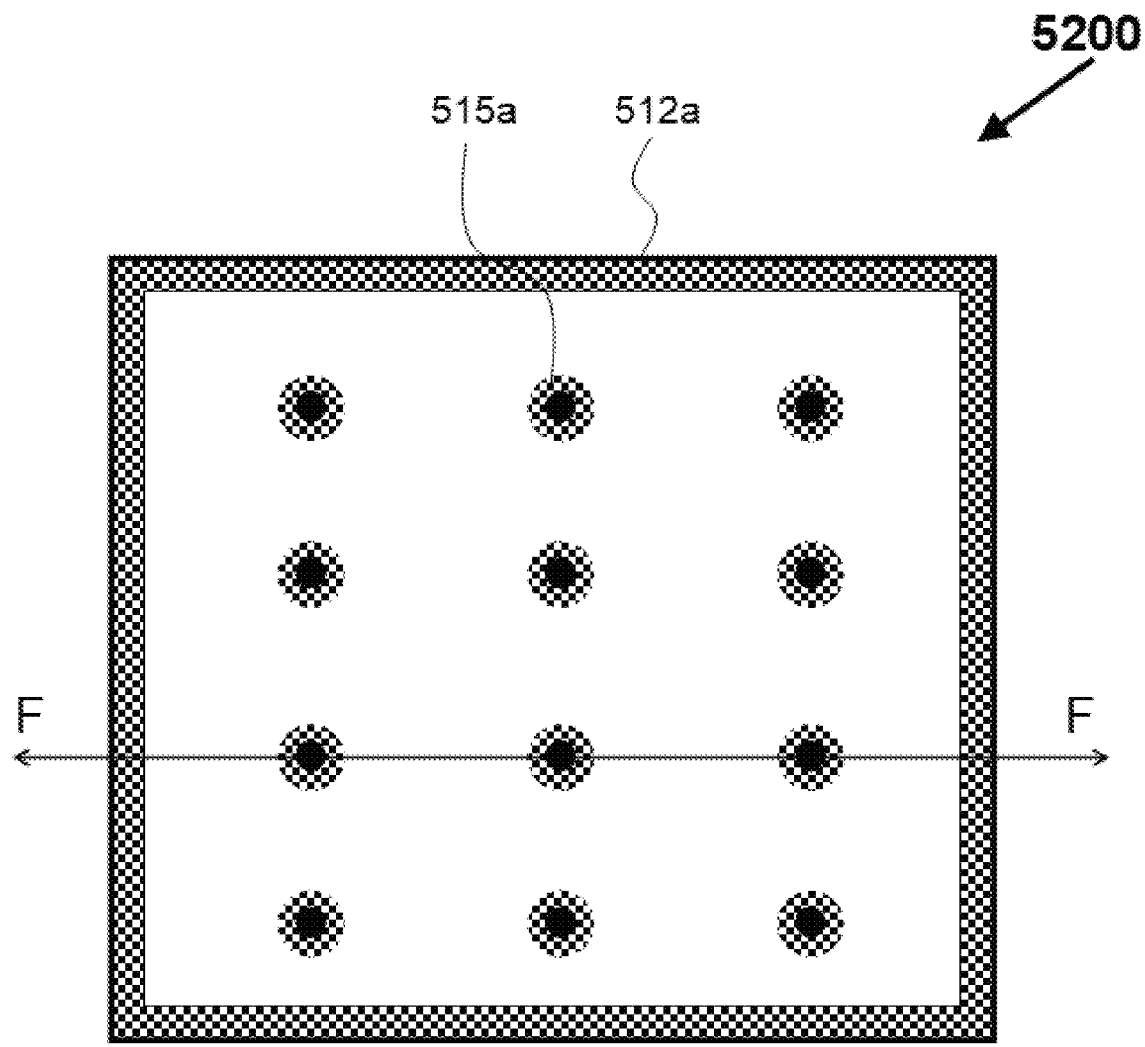

FIG. 5, FIG. 5A and FIG. 5B are schematic diagrams for illustrating a heat pipe or vapor chamber structure of another preferred embodiment of the present invention. The numerical symbol 5000 in FIG. 5 designates a cross-sectional view of a 3D heat exchanger 500, in which the numerical symbol 510 designates a heat pipe or vapor chamber structure including a bottom portion 511 and a top portion 512, the 513 designates a plurality of fin layers attached to the top portion 512, and the 515 designates a plurality of posts formed inside the bottom portion 511 as an option for a vapor chamber. The arrow lines D1 to D1 and D2 to D2 are two locations for a cross-sectional view to further display the structure of the 3D heat exchanger 500. The numerical symbol 5100 in FIG. 5A designates a cross-sectional top view of the 3D heat exchanger 500 from the cross-sectional location D1 to D1 in FIG. 5, in which the numerical symbol 512a designates the top portion 512 of the heat pipe or vapor chamber structure 510, and the 513a designates the plurality of fin layers 513. It is seen from the cross-sectional top view 512a that the top portion 512 of the heat pipe or vapor chamber structure 510 includes a plurality of heat pipes. The arrow line E to E shows a cross-sectional location to see the 3D heat exchanger 500 in FIG. 5. The numerical symbol 5200 in FIG. 5B designates a cross-sectional top view of the 3D heat exchanger 500 from the cross-sectional location D2 to D2 in FIG. 5, in which the numerical symbol 512a designates the bottom portion 512 of the heat pipe or vapor chamber structure 510, the 515a designates the plurality of posts 515. It is seen from FIG. 5, FIG. 5A and FIG. 5B that the bottom portion 511/511a is a vapor chamber and the plurality of heat pipes 512a are connected to it from its top side. The arrow line F to F shows a cross-sectional location to see the 3D heat exchanger 500 in FIG. 5.

Figure 6:
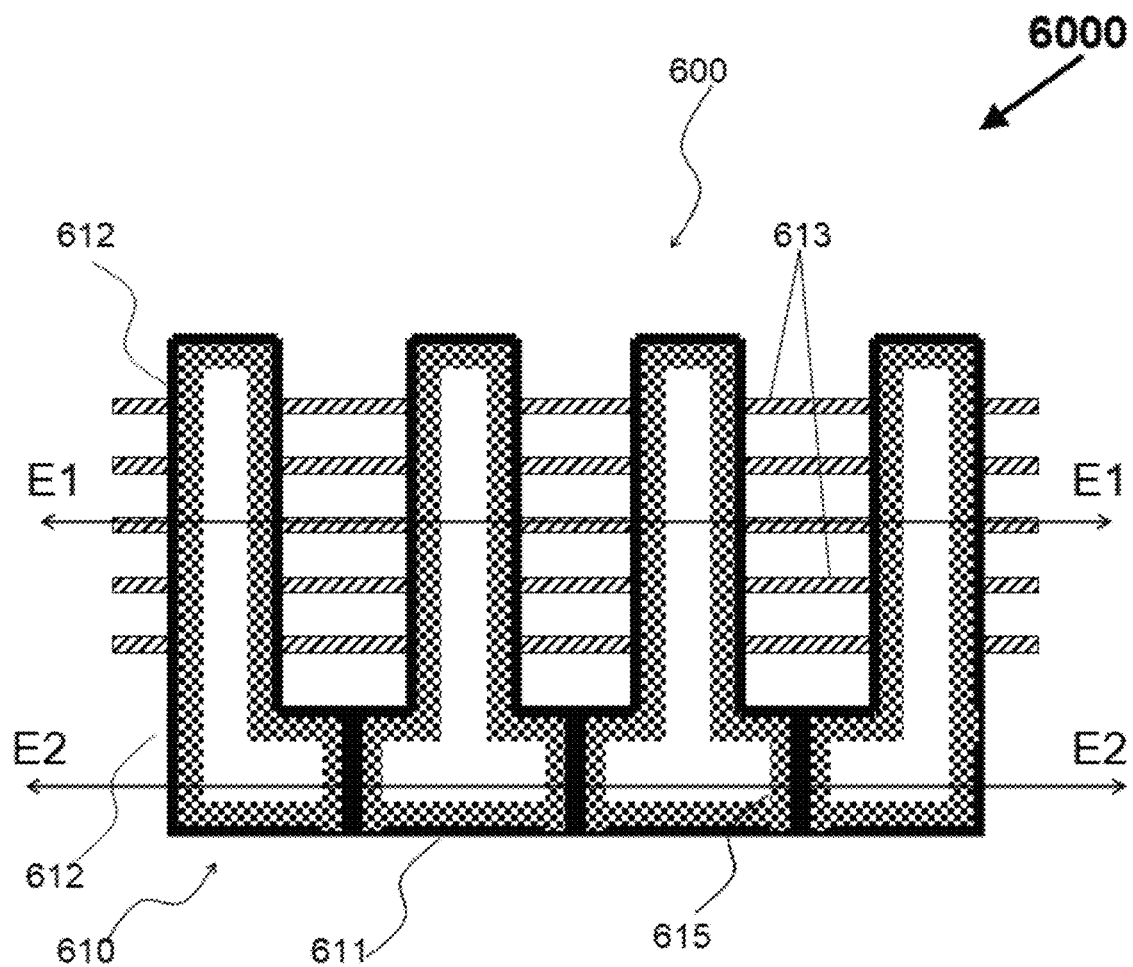
FIG. 6, FIG. 6A and FIG. 6B are schematic diagrams for illustrating another heat pipe or vapor chamber structure of one preferred embodiment of the present invention.
Figure 6A:
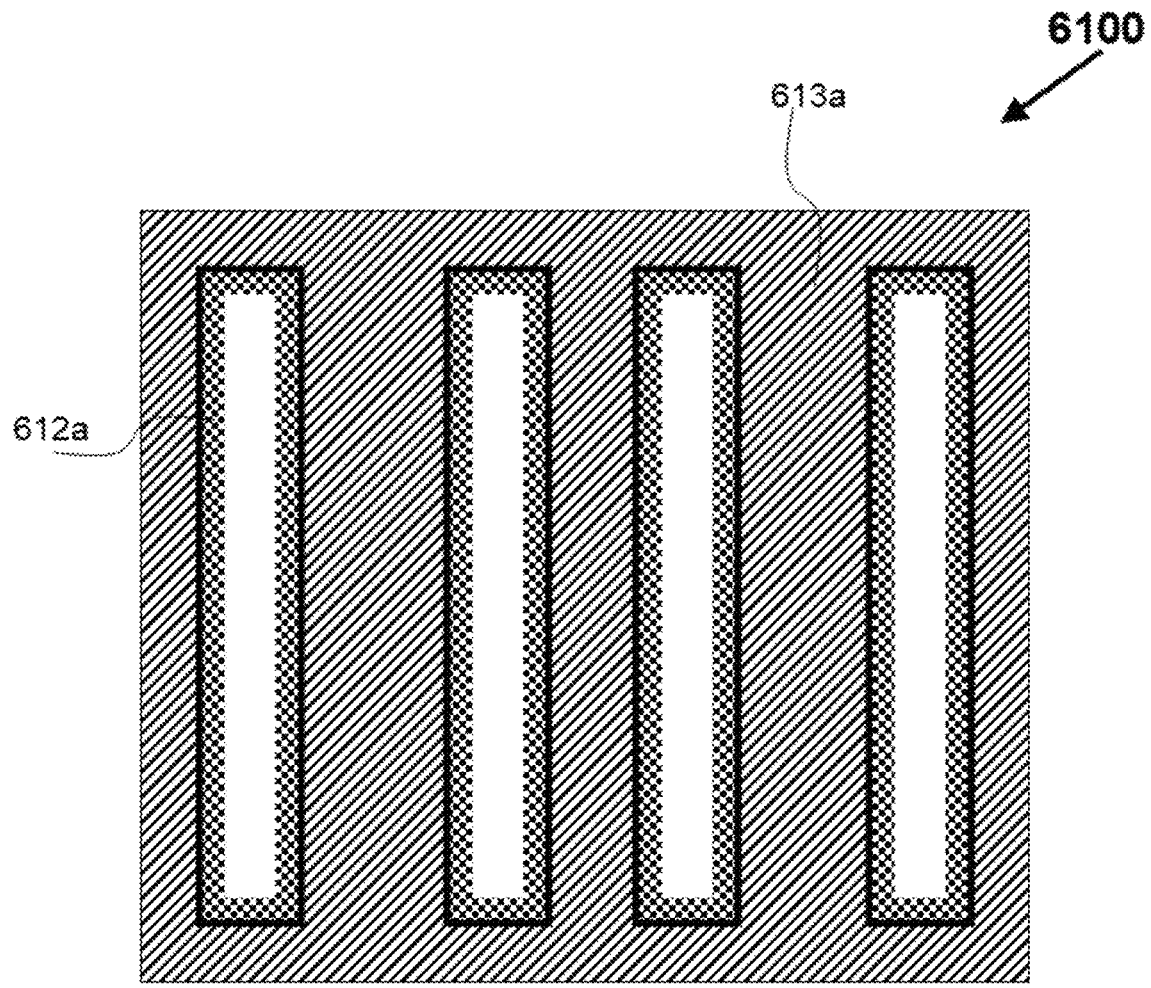
Figure 6B:
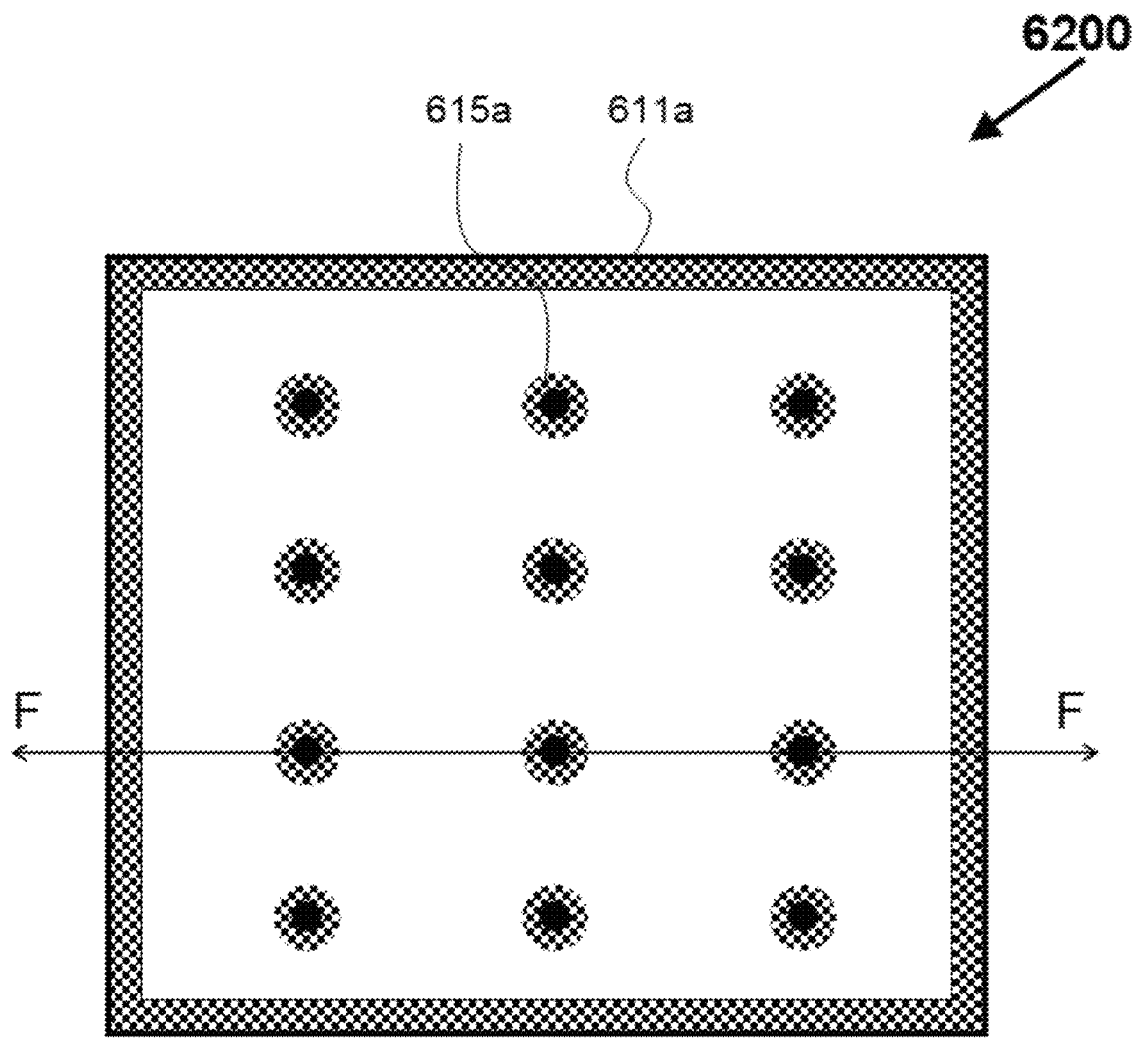

FIG. 6, FIG. 6A and FIG. 6B are schematic diagrams for illustrating another heat pipe or vapor chamber structure of one preferred embodiment of the present invention. The numerical symbol 6000 in FIG. 6 designates a cross-sectional view of a 3D heat exchanger 600, in which the numerical symbol 610 designates a heat pipe or vapor chamber structure including a bottom portion 611 and a top portion 612, the 613 designates a plurality of fin layers attached to the top portion 612, and the 615 designates a plurality of posts formed inside the bottom portion 611 as an option. The arrow lines E1 to E1 and E2 to E2 are two locations for a cross-sectional view to further display the structure of the 3D heat exchanger 600. The numerical symbol 6100 in FIG. 6A designates a cross-sectional top view of the 3D heat exchanger 600 from the cross-sectional location E1 to E1 in FIG. 6, in which the numerical symbol 612a designates the top portion 612 of the heat pipe or vapor chamber structure 610, and the 613a designates the plurality of fin layers 613. It is seen from the cross-sectional view 612a that the top portion 612 of the heat pipe or vapor chamber structure 610 includes a plurality of vapor chambers. The numerical symbol 6200 in FIG. 6B designates a cross-sectional view of the 3D heat exchanger 600 from the cross-sectional location E2 to E2 in FIG. 6, in which the numerical symbol 611a designates the bottom portion 611 of the heat pipe or vapor chamber structure 610, the 615a designates the plurality of posts 615 which are usually used for a vapor chamber as a support. It is seen from FIG. 6, FIG. 6A and FIG. 6B that the plurality of vapor chambers 612a are vertically aligned and the vapor chamber 611a is horizontally aligned, and the 612a are connected with the 611a to form a multiple connectivity of vapor chamber.

Figure 7:
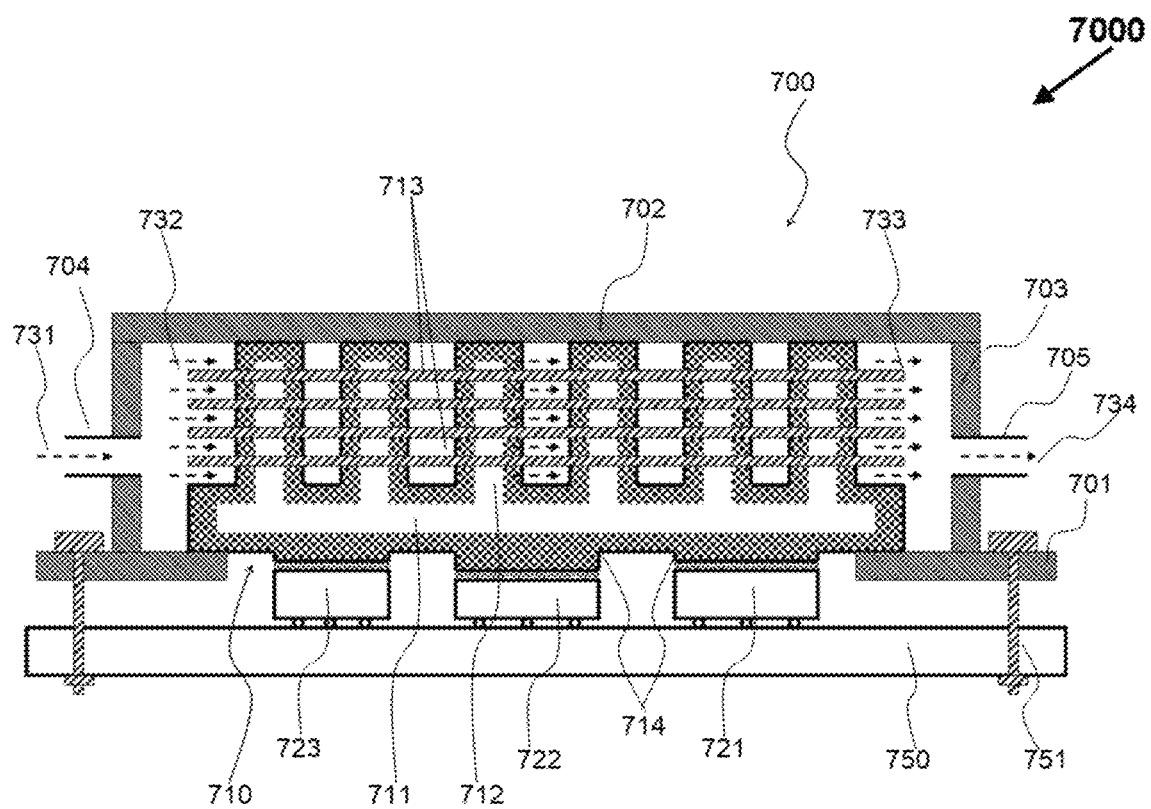
FIG. 7 is a schematic diagram for illustrating a panel type of 3D water block for cooling multiple heat sources of another preferred embodiment of the present invention.

FIG. 7 is a schematic diagram for illustrating a panel type of 3D water block of one preferred embodiment of the present invention. The numerical symbol 7000 in FIG. 7 designates a cross-sectional view of a panel type of 3D water block 700 which is attached onto a plurality of heat sources 721/722/723, such as a plurality of semiconductor chip packages, through a thermal interface material and a pedestal 714, in which the numerical symbol 700 designates the panel type of 3D water block, comprising: a box 701/702/703 including a base plate 701 and a cover 702/703 with a top piece 702 and a side wall 703, a 3D heat exchanger 710 which is enclosed inside the box, and a circulating liquid as illustrated by the dashed arrows 731/732/733/734. The numerical symbols 704 and 705 designate an inlet and an outlet of the box for the circulating liquid to flow into and out of the box. The 3D heat exchanger 710 includes a vapor chamber structure 711/712, and a plurality of fin layers 713 attached to the vapor chamber structure 711/712 so as to form a plurality of channels among the plurality of fin layers. The vapor chamber structure 711/712 includes a bottom vapor chamber 711 as a portion of the base plate 701 and a top portion 712 which vertically connects to the bottom vapor chamber 711 from its top side and extends upwards and fills inside the box. It is noted that when the plurality of heat sources have different heights, one or more pedestals such as the pedestal 714 can be designed to extend downwards from the bottom vapor chamber 711 to touch the plurality of heat sources. The circulating liquid 731/732/

733/734 flows into the box from the inlet 704, then passes the 3D heat exchanger 710 from one side to another side of the plurality of the fin layers 713 as shown by the dashed arrows from 732 to 733, and then flows out of the box from the outlet 705. When the circulating liquid 731/732/733/734 flows through the plurality of channels among the plurality of fin layers 713, it is heated by the 3D heat exchanger 710, or in other words a heat exchange between the circulating liquid and the 3D heat exchanger 710 takes place. It is noted that the panel type of 3D water block is attached onto the plurality of heat sources 721/722/723 by mounting it onto a PCB (printed circuit board) 750 through a screw fixture 751 as an example. And it is also noted that referring to the previous drawings in FIG. 5 to FIG. 6, the top portion 712 of the vapor chamber structure 711/712 includes a plurality of heat pipes or a plurality of vapor chambers vertically aligned and connected to the bottom vapor chamber 711 from its top side.

Figure 8:
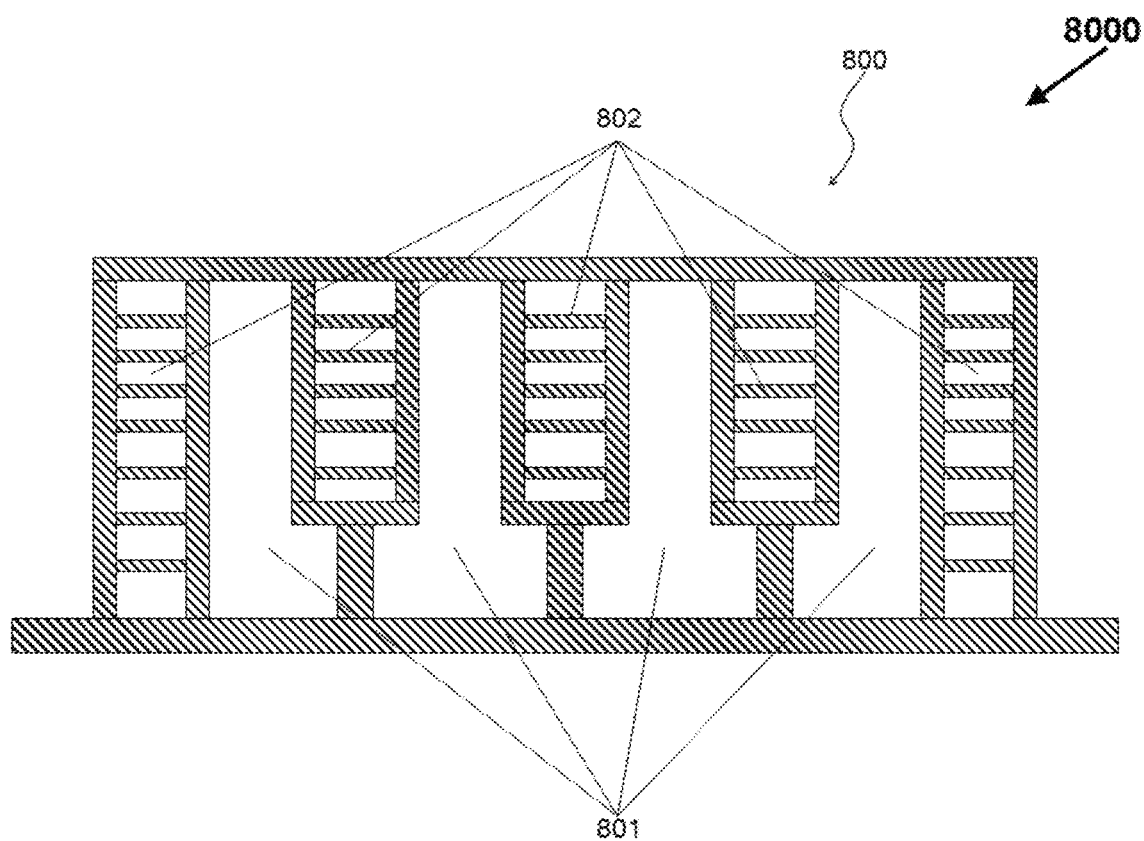
Figure 8A:
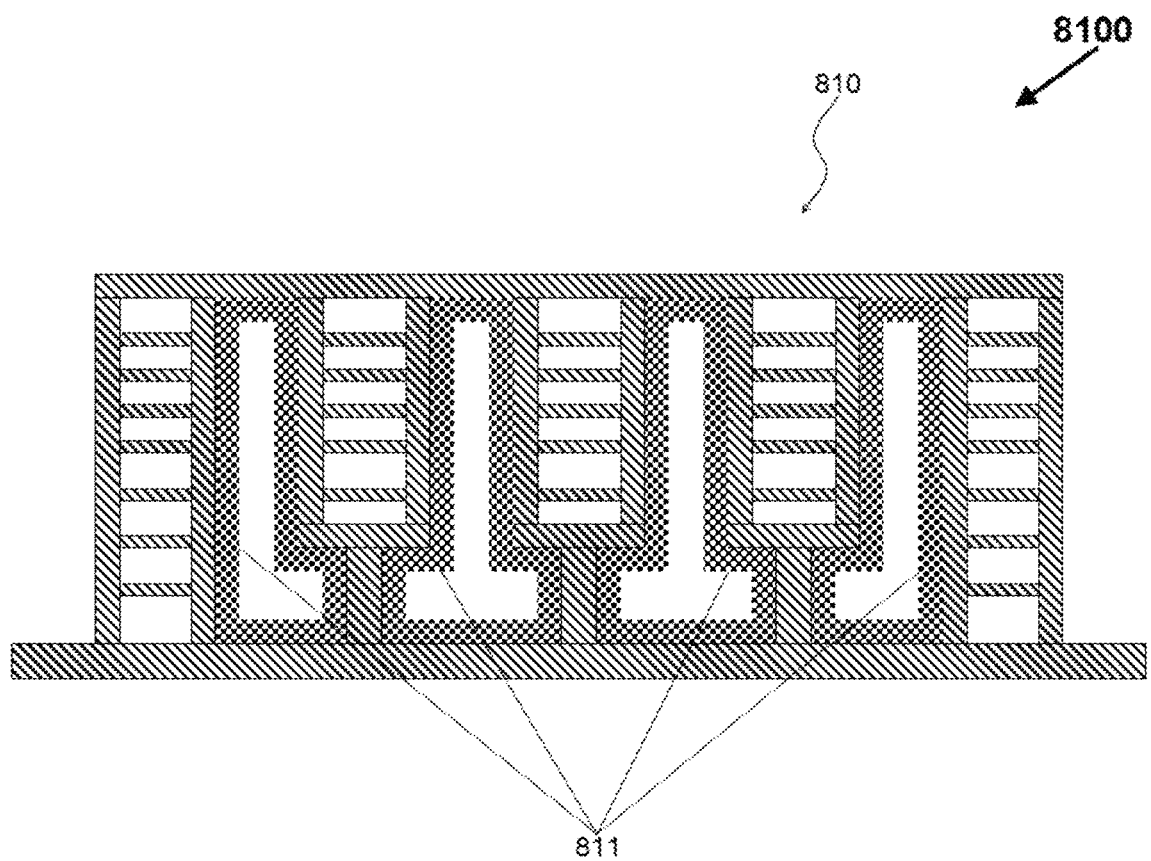
Figure 8B:
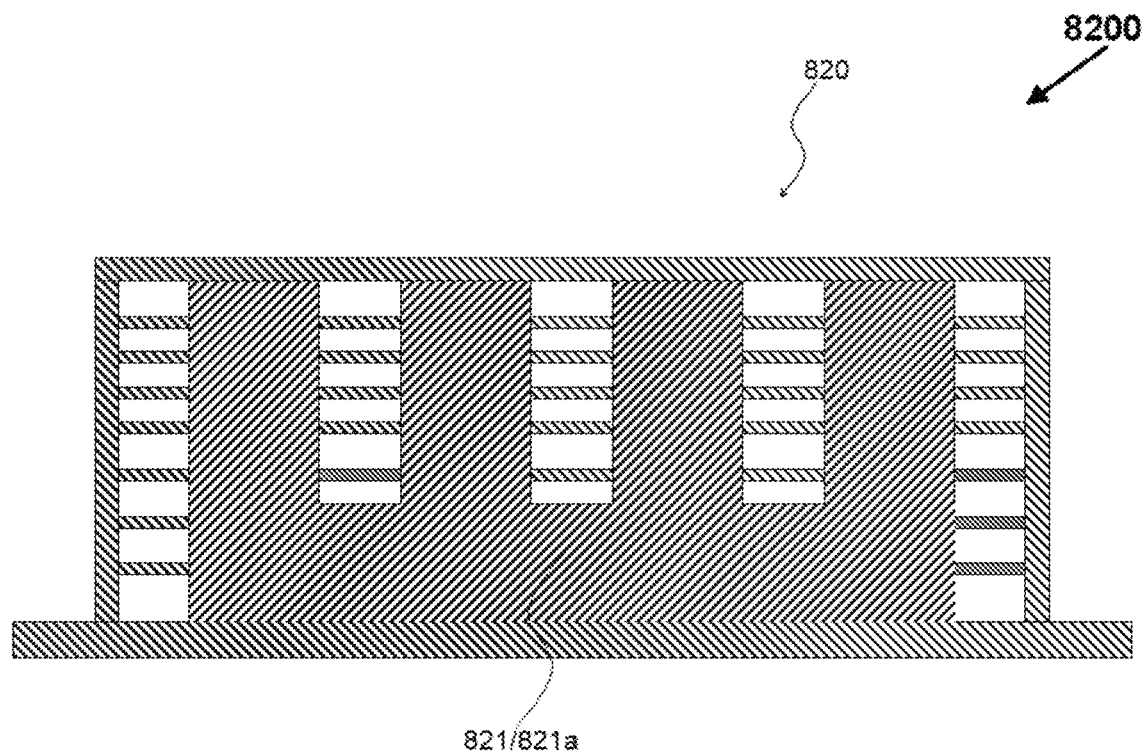
Figure 8C:
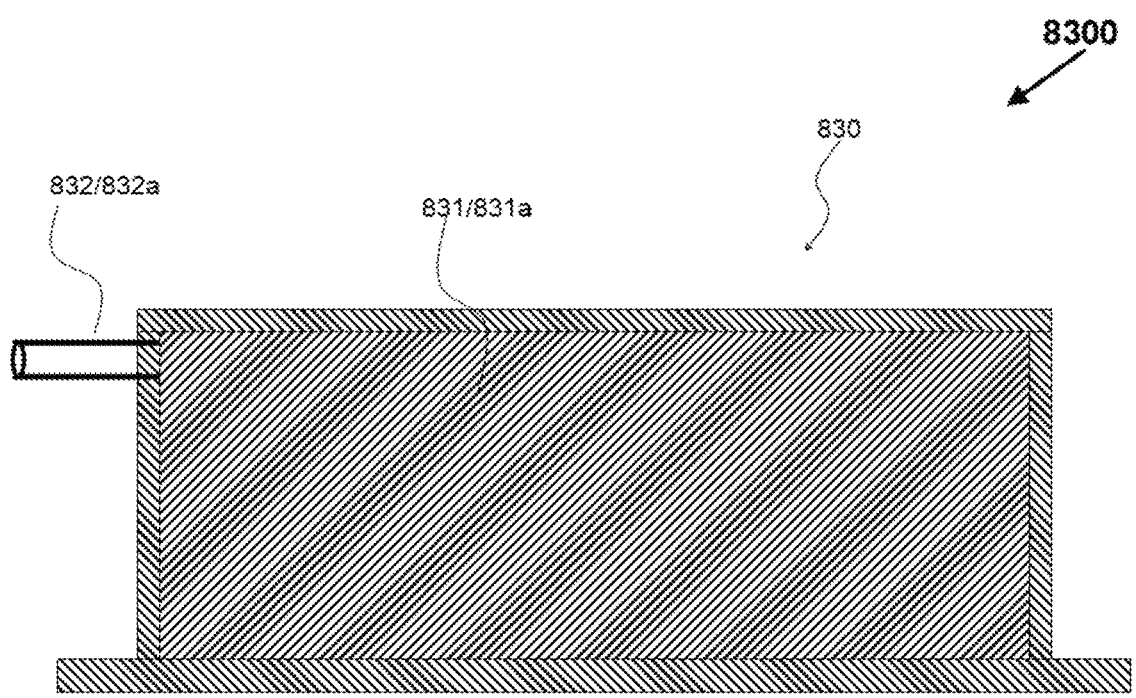

FIG. 8, FIG. 8A, FIG. 8A1, FIG. 8B, FIG. 8B1, FIG. 8C and FIG. 8C1 are schematic diagrams for illustrating a 3D water block with a vapor chamber structure and a method for making the same of one preferred embodiment of the present invention. The numerical symbol 8000 in FIG. 8 designates a cross-sectional view of an extruded part 800 for further making a vapor chamber structure, in which the numerical symbol 801 designates a plurality of cavities, and the 802 designates a plurality of tunnels with a plurality of fin layers. The numerical symbol 8100 in FIG. 8A is for illustrating that a wick layer is further formed based on the extruded part 800 as shown in FIG. 8, in which the numerical symbol 810 designates the extruded part 800 having a wick layer 811 on the inner surfaces of the plurality of cavities 801. The numerical symbol 8100A in FIG. 8A1 is a 3D schematic diagram for further illustrating the extruded part 810 as shown in FIG. 8A, in which the 810 displays each cross-sectional view. The numerical symbol 8200 in FIG. 8B is for illustrating that two ends of the plurality of cavities 801 as shown in FIG. 8 are covered by bonding two covering pieces 821/821a so as to form a vapor chamber structure 820, which is further illustrated by a 3D schematic diagram 8200A in FIG. 8B1, in which the numerical symbol 810 and 820 respectively designate a cross-sectional view at a middle region and a side view at the two ends of the vapor chamber structure 820. The numerical symbol 8300 in FIG. 8C is for illustrating that an inlet liquid chamber 831 with an inlet 832 and an outlet liquid chamber 831a with an outlet 832a are assembled on the two ends of the vapor chamber structure 820 as shown in FIG. 8B and FIG. 8B1 so as to form a 3D water block 830, which is further illustrated by a 3D schematic diagram 8300A in FIG. 8C1 to display the inlet liquid chamber 831 and the outlet liquid chamber 831a, in which the numerical symbol 810 and 820 display a cross-sectional view at a middle region and a side view of the two ends of the vapor chamber structure 820 as shown in FIG. 8B1, and the numerical symbols 831 and 831a display the inlet liquid chamber 831 and the outlet liquid chamber 831a assembled on the two ends of the 3D water block 830. In its application, a liquid is driven to flow into the 3D water block 830 from the inlet 832 and out of the 3D water block 830 from the outlet 832a so as to pass through the plurality of tunnels 802 as shown in FIG. 8.

It is noted that the base plate, the plurality of fin layers and the heat pipe or vapor chamber structure as described in conjunction with the drawings in FIG. 2 to FIG. 7 of the preferred embodiments of the present invention are separately formed and assembled together, while they are formed as one entity in the 3D water block 830 as described in conjunction with the drawings in FIG. 8 to FIG. 8C1, wherein a better thermal conduction among them can be achieved. It is also noted that the same way to combine the base plate, the plurality of fin layers and the heat pipe or vapor chamber structure as one entity can be applied to a panel type of 3D water block, which is not further depicted herein.

Although the present invention is described in some details for illustrative purpose with reference to the specific embodiments and drawings, it is apparent that many other modifications and variations may be made without departing from the spirit and scope of the present invention.

The invention claimed is:

1. A 3D (3-dimensional) water block for cooling a heat source of an electronic system such as a semiconductor chip package, comprising:

A box including a side wall and a base plate with a top surface and a bottom surface, a 3D heat exchanger, and a circulating liquid;

wherein the bottom surface of the base plate is attached to the heat source through a thermal interface material;

wherein the 3D heat exchanger includes a heat pipe or vapor chamber structure and a plurality of fin layers attached to the heat pipe or vapor chamber structure so as to form a plurality of channels among the plurality of fin layers;

wherein the heat pipe or vapor chamber structure includes a bottom portion attached on the top surface of the base plate or combined with the base plate as a portion of it and a top portion extending upwards from the base plate; and wherein the circulating liquid flows through the plurality of channels among the plurality of fin layers so as to take away heat generated by the heat source via the 3D heat exchanger.

2. The 3D water block of claim 1, wherein the heat pipe or vapor chamber structure comprises of a plurality of U-shaped heat pipes with a flat bottom portion.

3. The 3D water block of claim 1, wherein the bottom portion of the heat pipe or vapor chamber structure is a vapor chamber and the top portion of the heat pipe or vapor chamber structure includes a plurality of heat pipes connected to the vapor chamber along its peripheral edge region.

4. The 3D water block of claim 1, wherein the bottom portion of the heat pipe or vapor chamber structure is a vapor chamber, and the top portion of the heat pipe or vapor chamber structure includes a plurality of heat pipes connected to the vapor chamber at its top side.

5. The 3D water block of claim 1, wherein the heat pipe or vapor chamber structure consists of a horizontal vapor chamber and a plurality of vertical vapor chambers.

6. The 3D water block of claim 1, wherein there are two gaps between the 3D heat exchanger and the side wall of the box for the circulating liquid to flow through the plurality of channels among the plurality of fin layers from one side another side of it.

7. The 3D water block of claim 1, wherein the plurality of fin layers has a hole at its central region for the circulating liquid to flow through the plurality of channels among the plurality of fin layers from its central region to its peripheral region.

8. The 3D water block of claim 1, wherein the base plate, the plurality of fin layers and the heat pipe or vapor chamber structure are formed as an entity based on an extruded part.

9. The 3D water block of claim 8, which further comprises of an inlet liquid chamber and an outlet liquid chamber.

10. The 3D water block of claim 1, wherein the top portion of the vapor chamber structure includes a plurality of heat pipes connected to the bottom vapor chamber at its top side.

11. The 3D water block of claim 1, wherein the vapor chamber structure consists of a horizontal vapor chamber and a plurality of vertical vapor chambers.

12. The 3D water block of claim 11, which further comprises of an inlet liquid chamber and an outlet liquid chamber.

13. A panel type of 3D water block for cooling a plurality of heat sources of an electronic system such as a plurality of semiconductor chip packages on a PCB, comprising:

A box including a base plate, a 3D heat exchanger, and a circulating liquid;

wherein the base plate is attached to the plurality of heat sources through a thermal interface material;

wherein the 3D heat exchanger includes a vapor chamber structure attached with a plurality of fin layers, in which a plurality of channels form among the plurality of fin layers;

wherein the vapor chamber structure includes a bottom vapor chamber as a portion of the base plate, and a plurality of heat pipes or vapor chambers vertically connected to a top side of the bottom vapor chamber; and wherein the circulating liquid flows through the plurality of channels for taking away heat generated by the heat sources via the 3D heat exchanger.

14. The panel type of 3D water block of claim 13, wherein the bottom vapor chamber includes one or more pedestals extending downwards to touch the plurality of heat sources.

15. The panel type of 3D water block of claim 13, wherein the base plate, the plurality of fin layers and the vapor chamber structure are formed as an entity based on an extruded part.

16. The panel type of 3D water block of claim 13, wherein the circulating liquid flows through the plurality of channels from one side to another side of it.

* * * * *